US008386216B1

(12) United States Patent
Al-Hawari et al.

(10) Patent No.: US 8,386,216 B1
(45) Date of Patent: Feb. 26, 2013

(54) METHOD AND SYSTEM FOR ADAPTIVE MODELING AND SIMULATION OF LOSSY TRANSMISSION LINES

(75) Inventors: Feras Al-Hawari, Hudson, NH (US); Jilin Tan, Nashua, NH (US); Jose Schutt-Aine, Urbana, IL (US)

(73) Assignee: Cadence Design Systems, Inc., San Jose, CA (US)

( * ) Notice: Subject to any disclaimer, the term of this patent is extended or adjusted under 35 U.S.C. 154(b) by 631 days.

(21) Appl. No.: 12/640,357

(22) Filed: Dec. 17, 2009

(51) Int. Cl.
G06F 7/60 (2006.01)
G06F 17/10 (2006.01)
(52) U.S. Cl. ............................................ 703/2
(58) Field of Classification Search .................. 703/2
See application file for complete search history.

(56) References Cited

U.S. PATENT DOCUMENTS 6,460,165 B1 * 10/2002 Ismail et al. .................. 716/115
6,789,237 B1 * 9/2004 Ismail .......................... 716/113

OTHER PUBLICATIONS

Achar, R., et al.; "Simulation of High-Speed Interconnects"; Proceedings of the IEEE; vol. 89, No. 5, pp. 693-728, May 2001.
Roychowdhury, J. et al.; "Algorithms for the Transient Simulation of Lossy Interconnect"; IEEE Transactions on Computer-Aided Design of Integrated Circuits and Systems; vol. 13, No. 1, Jan. 1994.
Zhong, B.; "Lossy Transmission Line Modeling and Simulation Using Special Functions"; Ph.D. Dissertation; The University of Arizona; Department of Electrical and Computer Engineering; 2006.
Dhaene, T., et al.; "Selection of Lumped Element Models for Coupled Lossy Transmission Lines"; IEEE Transactions on Computer-Aided Design; vol. 11, No. 7, pp. 805-815, Jul. 1992.
Zhong, B., et al.; "Transient Simulation of Lossy Interconnects Based on a Dispersive Hybrid Phase-Pole Macromodel"; IEEE Transactions on Advanced Packaging; vol. 30, No. 2, pp. 321-334, May 2007.
Wang, J., et al.; "The Chebyshev expansion based passive model for distributed interconnect networks"; IEEE/ACM International Conference on Computer-Aided Design, Digest of Technical Papers; pp. 370-375, Nov. 1999.
Gao, R., et al.; "Black-Box Modeling by Rational Function Approximation," In Proceedings 8th IEEE Workshop on Signal Propagation on Interconnects; pp. 99-102, May 2004.
Beyene, W., et al.; "Interconnect Simulation Using Order Reduction and Scattering Parameters"; 48th IEEE Electronic Components and Technology Conference; pp. 627-631, May 1998.
Schutt-Aine, J., et al.; "Nonlinear Transient Analysis of Coupled Transmission Lines"; IEEE Transactions on Circuits and Systems; vol. 36, No. 7, pp. 959-967, Jul. 1989.
Chang, F.; "Transient Simulation of Frequency-Dependent Nonuniform Coupled Lossy Transmission Lines"; IEEE Transactions on Components, Packaging, and Manufacturing Technology—Part B: Advanced Packaging; vol. 17, No. 1, pp. 3-14, Feb. 1994.

(Continued)

*Primary Examiner* — Saif Alhija
(74) *Attorney, Agent, or Firm* — Rosenberg, Klein & Lee

(57) ABSTRACT

A method and system are provided for adaptively modeling and simulating high speed response of a transmission line. A simulation unit maintains a plurality of curve approximation options for modeling the transmission line. The suitability of a predefined primary one of the curve approximation options for modeling is determined based on frequency-domain modal scattering parameters obtained according to frequency-dependent data characterizing the transmission line. One of the options is selectively executed in response to the determination, in order to generate a macromodel of the transmission line. The primary option is executed upon determination of suitability, while a secondary one of the curve approximation options is alternatively executed upon determination of non-suitability. Transient simulation is then executed upon the resulting macromodel of the transmission line.

31 Claims, 14 Drawing Sheets

OTHER PUBLICATIONS

Kuznetsov, D., et al.; "The Optimal Transient Simulation of Transmission Lines"; IEEE Transactions on Circuits and Systems—I: Fundamental Theory and Applications; vol. 43, No. 2, pp. 110-121, Feb. 1996.

Gustavsen, B., et al.; "Rational approximation of frequency domain responses by vector fitting"; IEEE Trans. Power Delivery, vol. 14, No. 3, pp. 1052-1061, Jul. 1999.

Zhou, T., et al.; "Triangle Impulse Response (TIR) Calculation for Lossy Transmission Line Simulation"; IEEE Transactions on Advanced Packaging; vol. 25, No. 2, pp. 311-319; May 2002.

Celik, M., et al.; "Simulation of Dispersive Multiconductor Transmission Lines by Padé Approximation via the Lanczos Process"; IEEE Transactions on Microwave Theory and Techniques; vol. 44, No. 12, pp. 2525-2535, Dec. 1996.

Bracken, J., et al.; "S-Domain Methods for Simultaneous Time and Frequency Characterization of Electromagnetic Devices"; IEEE Transactions on Microwave Theory and Techniques; vol. 46, No. 9, pp. 1277-1290, Sep. 1998.

Tang, T., et al.; "Analysis of Lossy Multiconductor Transmission Lines using the Asymptotic Waveform Evaluation Technique"; IEEE Transactions on Microwave Theory and Techniques; vol. 39, No. 12, pp. 2107-2116, Dec. 1991.

Das, S., et al.; "Application of Asymptotic Waveform Evaluation for Analysis of Skin Effect in Lossy Interconnects"; IEEE Transactions on Electromagnetic Compatibility; vol. 39, No. 2, pp. 138-146, May 1997.

Beyene, W., et al.; "Transient Analysis of Diode Switching Circuits Using Asymptotic Waveform Evaluation"; IEEE Transactions on Computer-Aided Design of Integrated Circuits and Systems; vol. 16, No. 12, pp. 1447-1453, Dec. 1997.

Bracken, J., et al.; "Asymptotic Waveform Evaluation for S-domain Solution of Electromagnetic Devices"; IEEE Transactions on Magnetics, vol. 34, No. 5, pp. 3232-3235, Sep. 1998.

Chiprou, E., et al.; "Analysis of Interconnect Networks Using Complex Frequency Hopping (CFH)"; IEEE Transactions on Computer-Aided Design of Integrated Circuits and Systems; vol. 14, No. 2, pp. 186-200, Feb. 1995.

Mu, Z.; "Applications of Complex Frequency Hopping Method in PCB Signal Integrity Simulation"; Proceedings of the 1998 IEEE International Symposium on Circuits and Systems, ISCAS '98; vol. 6, pp. 78-81, 1998.

Achar, R., et al.; "Nonlinear Transient Simulation of Embedded Subnetworks Characterized by S-parameters Using Complex Frequency Hopping"; IEEE MTT-S International Microwave Symposium Digest; vol. 1, pp. 267-270, 1998.

Celik, M., et al.; "Simulation of Multiconductor Transmission Lines Using Krylov Subspace Order-Reduction Techniques"; IEEE Transactions on Computer-Aided Design of Integrated Circuits and Systems, vol. 16, No. 5, pp. 485-496, May 1997.

Gunupudi, P., et al.; "Nonlinear Circuit-Reduction of High-Speed Interconnect Networks Using Congruent Transformation Techniques"; IEEE Transactions on Advanced Packaging; vol. 24, No. 3, pp. 317-325, Aug. 2001.

A. Dounavis, E. Gad, R. Achar and M. Nakhla, "Passive Model-Reduction of Distributed Networks with Frequency-Dependent Parameters," IEEE MTT-S International Microwave Symposium Digest, vol. 3, pp. 1789-1792, Jun. 2000.

Cangellaris, A., et al.; "A New Discrete Transmission Line Model for Passive Model Order Reduction and Macromodeling of High-Speed Interconnections"; IEEE Transactions on Advanced Packaging; vol. 22, No. 3, pp. 356-364, Aug. 1999.

Yu, Q., et al.; "Passive Multipoint Moment Matching Model Order Reduction Algorithm on Multipart Distributed Interconnect Networks"; IEEE Transactions on Circuits and Systems—I: Fundamental Theory and Applications, vol. 46, No. 1, pp. 140-160, Jan. 1999.

Dounavis, A., et al.; "Efficient Passive Circuit Models for Distributed Networks with Frequency-Dependent Parameters"; IEEE Transactions on Advanced Packaging, vol. 23, No. 3, pp. 382-392, Aug. 2000.

* cited by examiner

METHOD AND SYSTEM FOR ADAPTIVE MODELING AND SIMULATION OF LOSSY TRANSMISSION LINES

BACKGROUND OF THE INVENTION

The present invention is directed to a method and system for modeling and simulating transmission lines. More specifically, the method and system serve to adaptively model and simulate lossy multi-conductor transmission lines representing conductive interconnections in a circuit layout, depending on the particularities of a given application. The method and system thereby provide for simulation and evaluation of transmission line transient behavior with an optimal combination of accuracy and, efficiency, even in high speed applications.

With recent advances in IC fabrication technology, and the ongoing development of computer and telecommunication systems, electronic designs operating at higher frequencies are becoming more prevalent. Data rates on the order of multi-Gbit/s, for instance, are not uncommon. In these applications, physical circuit interconnections such as conductive etches extending between neighboring components on a printed circuit board (PCB) cannot be modeled simply as ideal short-circuited point-to-point connections. At high operational frequencies, an interconnection is greater in its physical length than the transmitted signal's effective electrical length. There is generally a heightened sensitivity to transients and other factors which might otherwise be negligible, making a more precise modeling approach essential. Physical interconnections are therefore typically modeled as distributed transmission lines in high speed applications.

A distributed transmission line may impact the timing and integrity of transmitted signals through such factors as intrinsic propagation delay, skin effect, reflection, crosstalk, and the like. Thus, in order to verify that a high-speed design meets required timing and noise margins, there is a need for efficient and accurate measures by which to model and simulate lossy multi-conductor transmission lines.

While numerous simulation techniques are known in the art, there is still a need for an efficient and accurate modeling and simulation approach for lossy transmission lines, in particular for lossy multi-conductor transmission lines. There remains a need for such approach, whereby reliable simulation may be realized even in high frequency dependent environments, within broad operational frequency ranges.

SUMMARY OF THE INVENTION

It is an object of the present invention to provide a modeling and simulation method and system for lossy multi-conductor transmission lines generating efficient and accurate results in frequency dependent environment in wide range of operational frequencies.

It is a further object of the present invention to provide modeling and simulation technique based on scattering parameters (s-parameters) of transmission lines, whereby one of a plurality of simulation/modeling paths is selectively actuated for in a manner suitable for a particular transmission line.

It is yet another object of the present invention to provide a plurality of alternative modeling/simulation paths, whereby the selected path may be replaced with another upon an indication of unstable transient simulation resulting therefrom.

These and other objects are attained in a method for adaptively modeling and simulating high speed response of a transmission line, implemented in accordance with the present invention. The method comprises establishing a processing system which includes a simulation unit. A plurality of curve approximation options are established for modeling the transmission line. The simulation unit is actuated to selectively execute one of the curve approximation options in response to a corresponding determination of suitability to generate a macromodel of the transmission line. The determination of suitability is based on frequency-domain modal scattering parameters obtained for the transmission line according to frequency-dependent data characterizing the transmission line. Upon determination of suitability, a primary curve approximation option is executed, while a secondary one of the curve approximation options is alternatively executed upon determination of non-suitability. Transient simulation is then executed upon the macromodel of the transmission line.

In one exemplary embodiment, the determination of suitability includes initially defining a set of said frequency-domain modal scattering parameters for the transmission line based on the frequency-dependent data characterizing that transmission line. A propagation delay effect of the transmission line is extracted from the frequency-domain modal scattering parameters, thereby generating delay-less modal scattering parameter curves for the transmission line. The suitability of a predefined primary one of the curve approximation options for modeling is determined in response to the frequency-domain delay-less modal scattering parameter curves.

In another exemplary embodiment, the primary curve approximation option includes generating for each frequency-domain delay-less modal s-parameter curve a partial fraction representation defined by a set of real and complex poles and residues. The partial fraction representations of the frequency-domain delay-less modal s-parameter curves are thereafter transformed to the time-domain, thereby generating a time-domain state space model of the transmission line. The passivity of the time-domain state space model of the transmission line is next assessed and enforced; and, the propagation delay effect of the transmission line is inserted back into said time-domain state space model to generate corresponding time-domain state space model formulations. A Modified Nodal Analysis (MNA) stamp is suitably generated and applied based on the time-domain state space model formulations.

A system for adaptive modeling and high speed response simulation of a transmission line, implemented in accordance with the present invention comprises a simulation modeling unit and a transient simulator unit coupled thereto. The simulation modeling unit maintains a plurality of curve approximation options for modeling the transmission line. The unit selectively executes one of the curve approximation options in response to a corresponding determination of suitability to generate a macromodel of the transmission line. The determination of suitability is made based on frequency-domain modal scattering parameters obtained for the transmission line according to frequency-dependent data characterizing the transmission line. Upon determination of suitability, the simulation modeling unit executes the primary curve approximation option, while alternatively executing a secondary one of the curve approximation options upon determination of non-suitability. The transient simulator unit operates upon the macromodel of the transmission line to simulate its high speed response.

In one exemplary embodiment, the simulation modeling unit of the system includes a scattering parameters formulation unit executable to define a set of frequency-domain modal scattering parameters for the transmission line based on its characteristic frequency-dependent data. A propagation delay extracting unit coupled to the scattering parameters formulation unit is executable to extract from the frequency-domain modal scattering parameters a propagation delay effect of the transmission line, and thereby generate delay-less modal scattering parameter curves for the transmission line. A first decision unit is coupled to the delay extracting unit for making the determination of suitability. The first decision unit defines in response to the frequency-domain delay-less modal scattering parameter curves the suitability of a predefined primary one of the curve approximation options for modeling.

In another exemplary embodiment, the simulation modeling unit of the system, when configured for the primary curve approximation option, executes a vector fitting unit which generates for each frequency-domain delay-less modal s-parameter curve a partial fraction representation defined by a set of real and complex poles and residues. A state-space model unit coupled to the vector fitting unit thereafter transforms the partial fraction representations of the frequency-domain delay-less modal s-parameter curves to time-domain, thereby generating a time-domain state space model of the transmission line. A passivity enforcement unit coupled to state-space model unit is executed to assess and enforce the passivity of the time-domain state space model of the transmission line. A delay insertion unit coupled to the passivity enforcement unit then executes to insert the propagation delay effect of the transmission line into the time-domain state space model to generate corresponding time-domain state space model formulations. A stamp unit coupled to the delay insertion unit next generates and applies a Modified Nodal Analysis (MNA) stamp based on the time-domain state space model formulations.

BRIEF DESCRIPTION OF THE DRAWINGS

The features and advantages of the subject system and method will be apparent upon reading the following detailed description of the invention in conjunction with the Patent Drawing Figures, wherein.

DETAILED DESCRIPTION OF THE PREFERRED EMBODIMENTS

Figure 1:
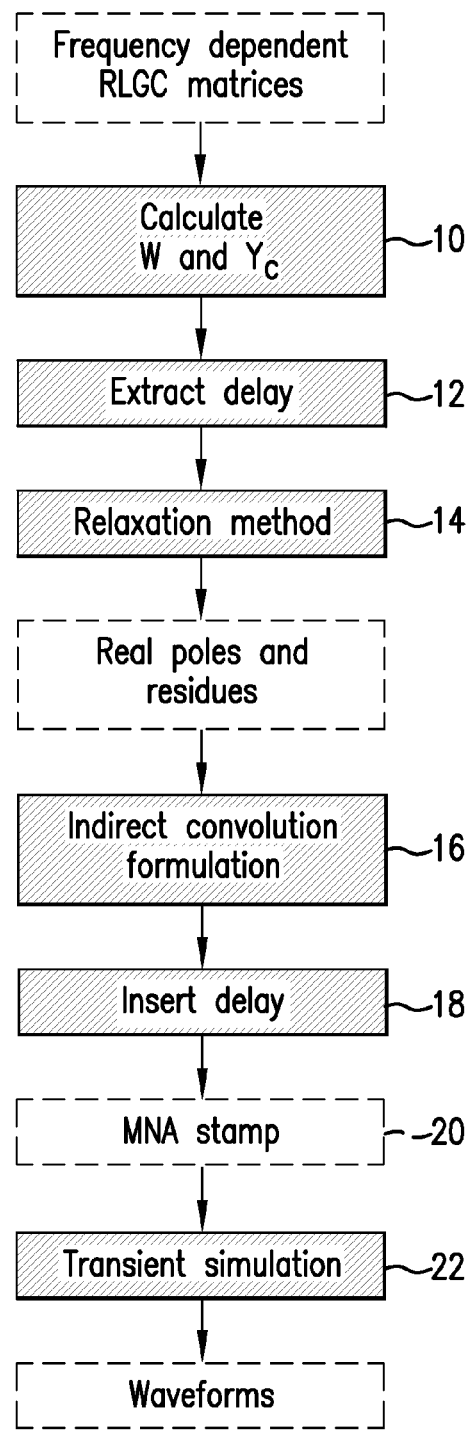
FIG. 1 is a flow chart diagram of a W-element technique of the prior art.

Various techniques for transient simulation of frequency dependent multi-conductor transmission lines are known in the art. Generally, the simulation techniques may be divided into two main groups:
  (1) Model order Reduction (MoR) based approaches wherein reduced-order models are generated for entire linear circuit networks that include transmission lines as well as lumped elements (capacitors, resistors, inductors, and the like), and
  (2) Macro-modeling based approaches wherein transmission lines in a circuit network are each represented by a corresponding macromodel.

MoR approaches are based on either explicit or implicit (indirect) moment matching. Explicit moment matching includes single moment matching techniques such as Advanced Waveform Evaluation (AWE), and multiple moment matching techniques such as Complex Frequency Hopping (CFH). Indirect moment matching techniques employ Krylov-subspace formulations and congruent transformation.

Macro-modeling based approaches include numerous known techniques, each of which is plagued by certain shortcomings and disadvantages. These known techniques include:

(a) Convolution based techniques presented, for example, in J. S. Roychowdhury, A. R. Newton, and D. O. Pederson, "Algorithms for the transient simulation of lossy interconnect," IEEE Transactions on Computer-Aided Design of Integrated Circuits and Systems, vol. 13, no. 1, pp. 96-104, January 1994; and, B. Zhong, "Lossy transmission line modeling and simulation using special functions," The University of Arizona, Ph.D. dissertation, May 2006. Convolution based models use Inverse Fast Fourier Transforms (IFFT) to transform a frequency-dependent transmission line representation into a time-domain representation (for example, to obtain an impulse response). In these techniques, direct convolution between the impulse response of a system and its input stimulus is performed in generating the corresponding macromodel. Unfortunately, such methods tend to be highly inefficient, as their computational complexities rise in potentially exponential proportion to the number of time steps occurring in the given simulation.

(b) Techniques involving direct discretization of transmission lines presented, for example, in T. Dhaene and D. De Zutter, "Selection of lumped element models for coupled lossy transmission lines," IEEE Transactions on Computer-Aided Design, vol. 11, pp. 805-815, July 1992. In these techniques, a transmission line is modeled as a chain of numerous lumped RLC segments. The resulting circuit representation of the transmission line may then be used directly in a suitable circuit simulator to obtain transient results. Such techniques, however, tend to introduce a much larger number of nodes in the circuit representation than may actually be present in the transmission line. This yields significant inefficiencies due in large part to the added processing necessitated by the additional nodes.

(c) Techniques based on Chebyshev polynomials to model a transmission line system, as presented in J. M. Wang, E. S. Kuh, and Qinglian Yu, "The Chebyshev expansion based passive model for distributed interconnect networks," IEEE/ACM International Conference on Computer-Aided Design, Digest of Technical Papers, pp. 370-375, November 1999; and R. Gao, Y. Mekonnen, W. Beyene, and J. Schutt-Aine, "Black-box modeling by rational function approximation," In Proceedings $8^{th}$ IEEE Workshop on Signal Propagation on Interconnects, pp. 99-102, May 2004. These modeling/simulation techniques do not preserve the passivity of the macromodels they generate for a transmission line system.

(d) Order reduction techniques, such as presented in W. T. Beyene and J. E. Schutt-Aine, "Interconnect simulation using order reduction and scattering parameters," $48^{th}$ IEEE electronic Components and Technology Conference, pp. 627-631, May 1998. These techniques use least square approximation to represent the frequency response of a transmission line system. In many cases, the approximation may be ill-conditioned, and passivity may not be preserved in the corresponding macromodel.

(e) W-element techniques, popular variants on the Method of Characteristics (MoC) based techniques, are presented for example in D. Kuznetsov and J. Schutt-Aine, "The optimal transient simulation of transmission lines," IEEE Trans. on Circuits and Systems, vol. cas-43, pp. 110-121, 1996. W-element techniques are employed in a number of commercially available circuit simulators to perform transient simulation of frequency-dependent transmission lines. The techniques are based on a propagation function (W) and a characteristic admittance matrix ($Y_c$) obtained for the given transmission line. They employ a suitable relaxation method known in the art to obtain partial fractions for W and $Y_c$, then generate a macromodel representation of the transmission line using indirect convolution.

Referring to the flow diagram of FIG. 1, an exemplary W-element technique known in the art is more specifically illustrated. The technique uses distributed RLGC (Resistance, Inductance, Conductance, Capacitance) parameters to calculate at block 10 a characteristic admittance matrix $Y_c$ as well as a characteristic forward and backward current wave propagation function W. At block 12, a propagation delay is extracted from the W and $Y_c$ formulations using matrix delay separation formulas, such as presented in D. Kuznetsov, et al. This serves to reduce the order of propagation functions subsequently generated.

At block 14, a relaxation method known in the art is employed to obtain partial fractions for W and $Y_c$. In addition to producing partial fractions, the relaxation method generates approximations of real poles and residues of resulting curves. At block 16, a macromodel is generated for the system using indirect convolution. Further, at block 18, the propagation delay which was previously extracted at block 12 is added back into the indirect convolution formulation, and a Modified Nodal Analysis (MNA) stamp is applied at block 20. Transient simulation is thereafter carried out at block 22 to produce output waveforms.

Despite its wide use, the W-element technique also suffers from particular shortcomings and disadvantages. The technique does not necessarily preserve passivity in the generated macromodel. Moreover, it may not prove sufficiently accurate where the transmission lines' RLGC parameters are highly dependent on frequency (for example, exhibiting numerous peaks and valleys in corresponding waveforms), where the computational points are excessive in number (for example, on the order of 1,000 points), or where the operational frequency range is excessively wide (for example, 50 GHz).

In overall concept, the method and system formed in accordance with the present invention compute, among other things, models for transmission lines which enable accurate simulation of their transient responses to signals in a high speed operational environment. The method and system generate such models selectively employing one of a plurality of alternative modeling approaches. Preferably, a preselected approach, such as one based upon modal scattering parameters (s-parameters) computed for the given transmission lines, is established as a primary modeling approach (as described in following paragraphs), with at least one other alternative approach established as a secondary modeling approach. The primary modeling approach may not be the most suitable for model generation in all cases. In accordance with one aspect of the present inventions, therefore, the primary approach is selectively applied only where it is determined to actually be suitable. Where it is not, a secondary approach is automatically checked and adopted if more suitable, so as to preserve an optimal balance of computational stability and accuracy in subsequent simulation processing. The resulting method and system are particularly well suited for modeling and simulation of distributed transmission lines.

In accordance with certain exemplary embodiments of the present invention, the method and system carry out modeling and transient simulation of multi-conductor transmission lines based on macro-modeling techniques and evaluation of frequency-domain scattering parameters corresponding to the transmission lines. The suitability of alternative modeling approaches is preferably determined based upon s-parameters obtained from the given transmission lines' characteristic information, including for instance their RLGC parameters. Suitable modeling approaches employed in the exemplary embodiment disclosed include a modal s-parameter approach such as a vector fitting based S-element approach; a W-element approach; and, a fast convolution based approach.

S-element is preferably established as the primary approach, and is based on the number of maximum and minimum points in s-parameter curves derived for the transmission lines. Where selected, the approximations involved in S-element approach are improved by adjusting the number of starting poles when computational results fail to converge.

Figure 2A:
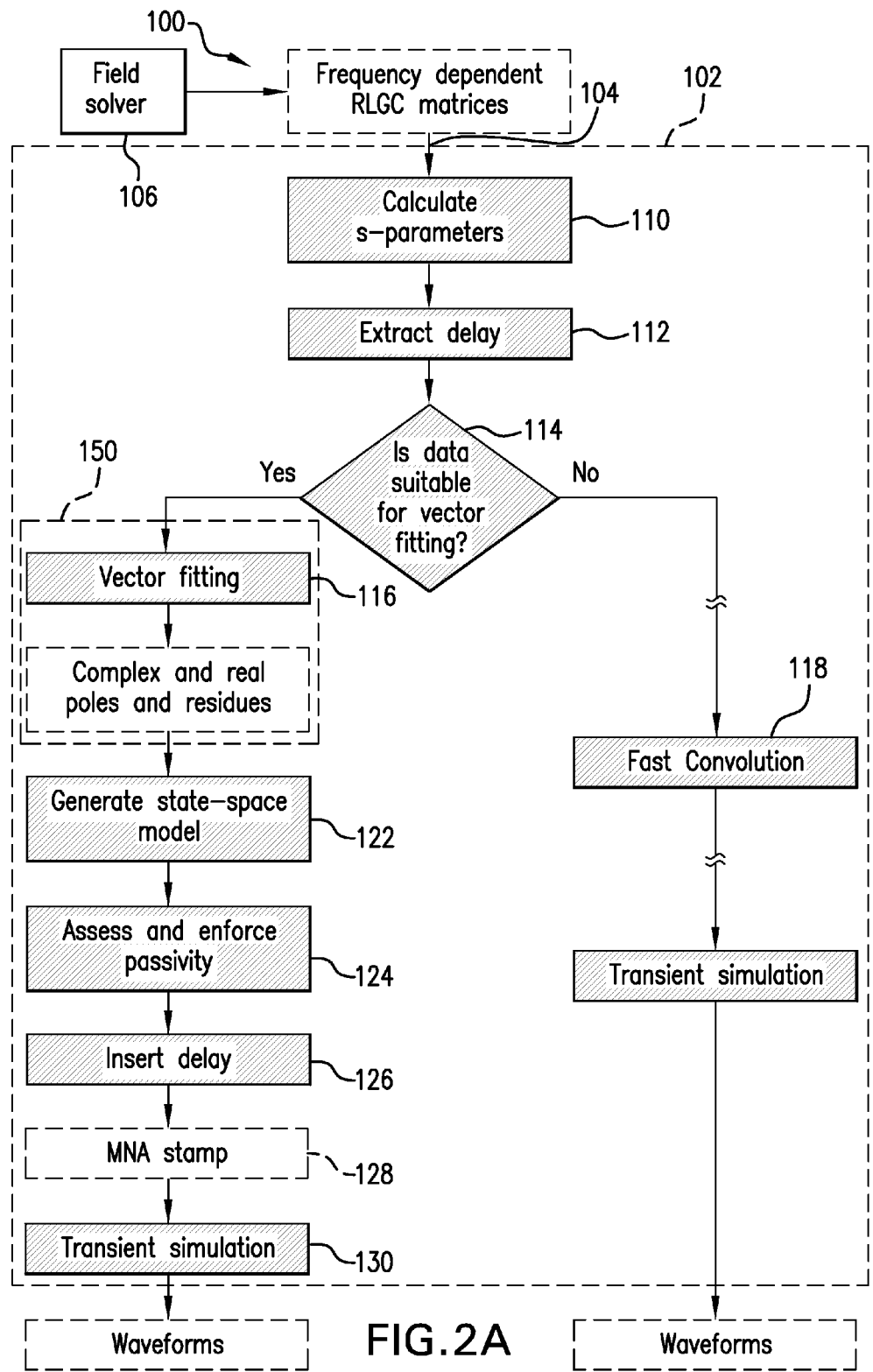
FIG. 2A is a schematic diagram of a system formed in accordance with an exemplary embodiment of the present invention, illustrating a flow of processes executed therein.

Referring to FIG. 2A, there is illustrated a modeling/simulating system 100 formed in accordance with an exemplary embodiment of the present invention. System 100 includes a simulation unit 102 which selectively supports a plurality of alternative modeling/simulation approaches, as discussed in following paragraphs. System 100 is coupled to receive from a field solver 106 at its input 104 a set of frequency dependent RLGC matrices which characterize a multi-conductor lossy transmission line of interest. The RLGC matrices are preferably provided in frequency-dependent per-unit-length (p.u.l.) form by field solver 106, which may be of 2-D quasi-static, full-wave, or any other suitable type known in the art.

Simulation unit 102 may be programmably implemented in one or more microprocessor based platforms of any suitable type known in the art. Simulation unit 102 is operable, as indicated at block 110, to suitably generate scattering parameters (s-parameters) to model the transmission line based on the received RLGC matrices. S-parameter-based modeling may offer advantages in many applications over W-element based modeling or other such techniques, as parameter values range in magnitude between 0 and 1 at all frequencies, affording easier approximation than, for instance, admittance parameters ($Y_c$). At block 112, simulation unit 102 operates to extract from the s-parameters the effects of the modeled transmission line's intrinsic propagation delay. This serves to significantly reduce the order of the functions subsequently produced and operated upon.

Figure 6:
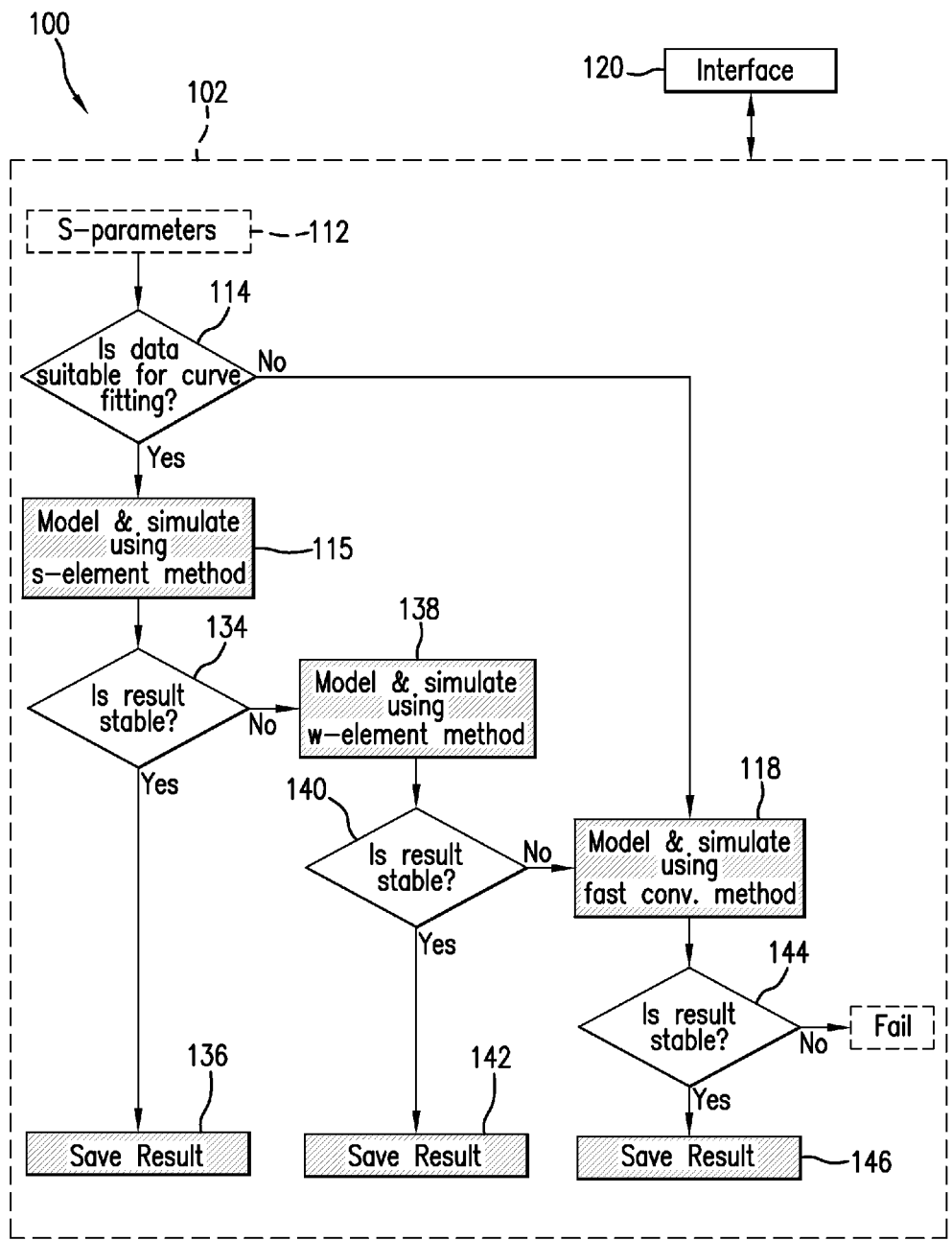
FIG. 6 is a flow diagram schematically illustrating the execution of processes within a portion of a simulation unit employed in accordance with an exemplary embodiment of the present invention, wherein alternative modeling/simulating paths for modeling/simulation are supported.

At this point, a determination is made (block 114) as to whether the s-parameter data, in its delay-less form, is suited for the primary vector fitting approach to modeling, initiated at block 116. If so, the processing flow proceeds to block 116. If not, one or more secondary approaches is selected from and appropriately actuated, where sufficiently suitable, in place of vector fitting. Such secondary approaches, indicated at block 118, preferably include a fast convolution technique, but may also include one or more other suitable techniques known in the art (such as the W-element technique) as shown in FIG. 6 for use in place of, or as a supplement to, the fast convolution technique shown.

Where the vector fitting approach is selected, the s-parameters are re-formulated by approximating a partial fraction representation for each of the delay-less s-parameter's data. This approximation may be carried out using any suitable vector fitting technique known in the art. Real as well as complex poles and residues are generated. This supports the representation of any transmission line system. A relaxation method of approximation, in contrast, would support representation of a system only with real coefficients, leaving room for inaccuracies.

The partial fraction representations obtained for the s-parameters are at this point in the frequency domain. At block 122, the frequency-domain partial fractions are transformed into the time-domain using a suitable state-space model formulation. In accordance with another aspect of the present invention, a passivity of the resulting state-space model is assessed then enforced if needed, at block 124, preferably by perturbing the partial fractions residues and solving the corresponding linear equality-constrained least squares (LSE) problem. The propagation delay effects which had been extracted earlier are thereafter inserted back into the time-domain equations at block 126, and a Modified Nodal Analysis (MNA) stamp is generated at block 128. Transient simulation is carried out on the resulting model at block 130, whereupon the waveforms reliably reflecting the transient behavior of the given transmission line may be obtained.

The fast convolution based approach indicated at block 118 is preferably a variant of convolution based techniques known in the art, configured to yield generally faster operation than other convolution based techniques heretofore known. In accordance with one aspect of the present invention, fast convolution approach 118 makes use of only the dominant terms in the transmission line's characteristic impulse response in carrying out convolution based modeling and transient simulation of the line. Exclusive use of the dominant terms affords accelerated levels of direct convolution performance (approaching $O(n)$ computational complexity—as opposed to the $O(n^2)$ levels observed in comparable approaches, where n is proportional to the number of time steps in the simulation), with little if any appreciable effect on accuracy.

Certain portions of simulation unit 102 in the disclosed embodiment are more specifically described in turn below. While variously referred to herein as 'logic units,' 'processing flow blocks,' or the like, it is to be understood that the different portions of simulation unit 102 may be suitably implemented in software and/or hardware, according to the particular requirements of the intended application. Preferably, the different logic units are programmably implemented in one or more microprocessor based machines, equipped with or otherwise operably coupled to suitable data storage and communications interface devices.

S-Parameter Formulation

Simulation unit 102 receives at its input 104 information characterizing the physical interconnection which forms the transmission line of interest. The information is typically made available by field solver 106 in terms of frequency-dependent per-unit-length RLGC parameter values. The values are preferably provided in matrix form, wherein a set of matrices are defined respectively for the different parameters at each frequency value of interest. Each individual matrix contains one or more values corresponding to parameter values at corresponding points of the given transmission line system.

Figure 15:
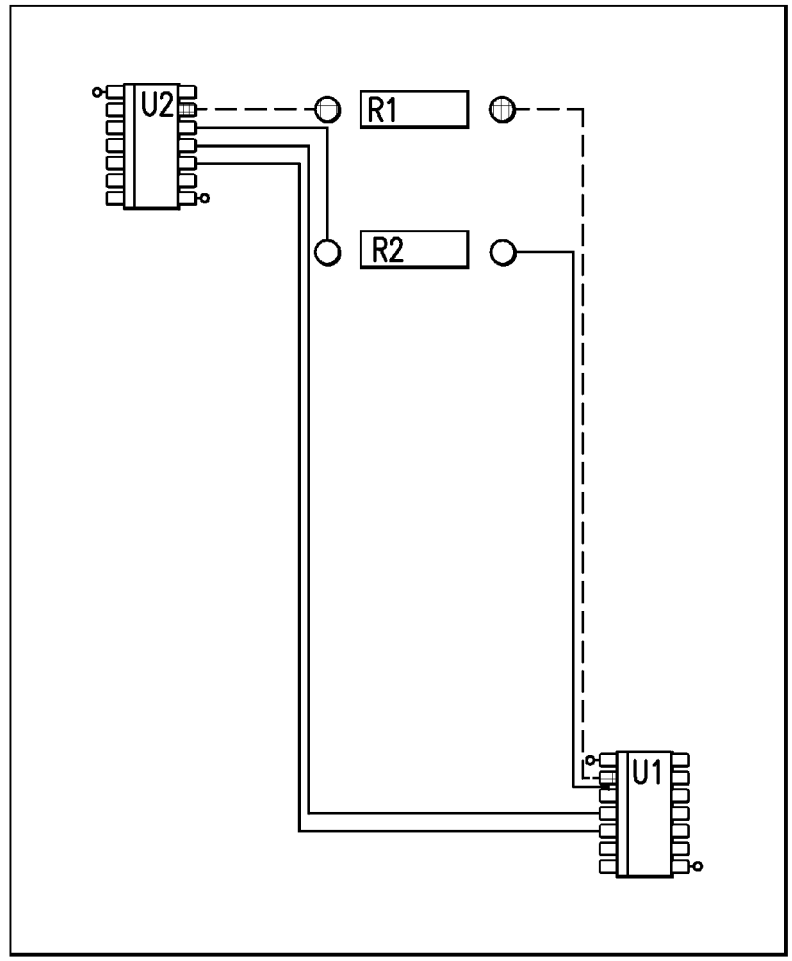
FIG. 15 is a schematic representation of a post-layout PCB design, illustratively highlighting a net selected for modeling and simulation.
Figure 16:
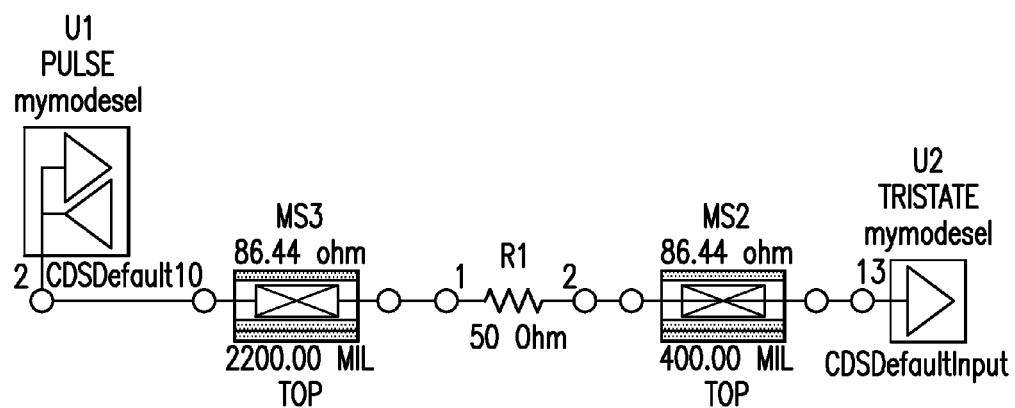
FIG. 16 is a representation of the circuit topology corresponding to the net illustratively highlighted in FIG. 15.

Examples of such frequency dependent p.u.l. RLGC matrices are shown in Tables 1 and 2. Table 1 illustrates the RLGC matrix data for a single microstrip transmission line contained in the routed PCB example of FIG. 15 (whose circuit representation is shown in FIG. 16) which are described in following paragraphs. Table 2 illustrates the RLGC matrix data for a coupled transmission line example depicted in FIG. 10. In both examples, the RLGC data is provided for frequencies within the range between 0 Hz and 50 GHz, with the R, L, G, C values represented in their respective units of Ohms, Henris, Mhos (1 mho=1/ohm), and Farads.

TABLE 1

| DATAPOINTS RLGC MS3 |
| --- |
| FREQUENCY=0 |
| CMATRIX |
| 6.518000e−11 |
| GMATRIX |
| 0.000000e+00 |
| LMATRIX |
| 4.870200e−07 |
| RMATRIX |
| 3.586500e+00 |
| FREQUENCY=1 |
| CMATRIX |
| 6.518000e−11 |
| GMATRIX |
| 1.433400e−11 |
| LMATRIX |
| 4.870200e−07 |
| RMATRIX |
| 3.588000e+00 |
| — |
| FREQUENCY=5e+10 |
| CMATRIX |
| 6.518000e−11 |
| GMATRIX |
| 7.166900e−01 |
| LMATRIX |
| 4.870200e−07 |
| RMATRIX |
| 3.354400e+02 |
| END RLGC |

TABLE 2

| DATAPOINTS RLGC Coupled | |
| --- | --- |
| FREQUENCY=0 | |
| CMATRIX | |
| 6.759700e−11 | −1.619100e−11 |
| −1.619100e−11 | 6.759700e−11 |
| GMATRIX | |
| 0.000000e+00 | 0.000000e+00 |
| 0.000000e+00 | 0.000000e+00 |
| LMATRIX | |
| 5.139100e−07 | 1.746000e−07 |
| 1.746000e−07 | 5.139100e−07 |
| RMATRIX | |
| 7.225300e+00 | 0.000000e+00 |
| 0.000000e+00 | 7.225300e+00 |
| FREQUENCY=1 | |
| CMATRIX | |
| 6.759700e−11 | −1.619100e−11 |
| −1.619100e−11 | 6.759700e−11 |
| GMATRIX | |
| 1.486500e−11 | −3.560600e−12 |
| −3.560600e−12 | 1.486500e−11 |
| LMATRIX | |
| 5.139100e−07 | 1.746000e−07 |
| 1.746000e−07 | 5.139100e−07 |
| RMATRIX | |
| 7.226900e+00 | 0.000000e+00 |
| 0.000000e+00 | 7.226900e+00 |
| — | |
| FREQUENCY=5e+10 | |
| CMATRIX | |
| 6.759700e−11 | −1.619100e−11 |
| −1.619100e−11 | 6.759700e−11 |

TABLE 2-continued

| DATAPOINTS RLGC Coupled | |
| --- | --- |
| GMATRIX | |
| 7.432700e−01 | −1.780300e−01 |
| −1.780300e−01 | 7.432700e−01 |
| LMATRIX | |
| 5.139100e−07 | 1.746000e−07 |
| 1.746000e−07 | 5.139100e−07 |
| RMATRIX | |
| 3.637500e+02 | 0.000000e+00 |
| 0.000000e+00 | 3.637500e+02 |
| END RLGC | |

Upon receiving the frequency dependent p.u.l. RLGC data, simulation unit 102 executes processes programmed therein to initiate computation of the scattering parameters (s-parameters) for the transmission line of interest in logic block 110. The s-parameters may be derived in any suitable manner known in the art. One example is presented in J. Schutt-Aine and R. Mittra, "Nonlinear transient analysis of coupled transmission lines," IEEE Trans. On Circuits and Systems, vol. 36, no. 7, pp. 959-967, July 1989.

A preliminary modal transmission line solution may be obtained from the characteristic RLGC data as follows. A frequency domain formulation for a lossy line system may be described generally by:

$$-\frac{\partial V(x,\omega)}{\partial x} = Z(\omega)I(x,\omega) \tag{1a}$$

$$-\frac{\partial I(x,\omega)}{\partial x} = Y(\omega)V(x,\omega) \tag{1b}$$

where, $Z=R+j\omega L$ and $Y=G+j\omega C$, and Z and Y are the matrices of impedance and admittance per-unit-length of the transmission line, respectively; x represents a distance; and, $\omega$ represents the angular frequency corresponding to a frequency f, wherein $\omega=2\pi f$. By combining equations (1a) and (1b), the following equations are attained:

$$\frac{\partial^2 V}{\partial x^2} = ZYV \tag{2a}$$

$$\frac{\partial^2 I}{\partial x^2} = YZI \tag{2b}$$

In order to diagonalize the system of equation (2a-2b), it is transformed to its modal form to obtain the following representations:

$$\frac{\partial^2 V_m}{\partial x^2} = \Lambda_m^2 V_m \tag{3a}$$

$$\frac{\partial^2 I_m}{\partial x^2} = \Lambda_m^2 I_m \qquad (3b)$$

where $V_m$=EV and $I_m$=HI are the modal voltage and current vectors, respectively, and E and H are the voltage and current transformation vectors, respectively. $\Lambda^2_m$ is the diagonal eigenvalue matrix defined:

$$EZYE^{-1} = HYZH^{-1} = \Lambda^2_m \qquad (4)$$

Thus, the frequency domain solution for the system of equations (3a, 3b) is formulated according to the relationships:

$$V_m(x) = W(-x)A + W(x)B \qquad (5a)$$

$$I_m(x) = Z_m^{-1}\{W(-x)A + W(x)B\} \qquad (5b)$$

where $Z_n = E^{-1}\Lambda^{-1}_m EZ$, as derived, for example, in J. Schutt-Aine and R. Mittra, "Nonlinear transient analysis of coupled transmission lines", IEEE Trans. On Circuits and Systems, vol. 36, no. 7, pp. 959-967, July 1989; and, A and B are modal coefficients associated with the forward and backward propagation waves.

The complex propagation matrix W(u) is given by $$W(u) = \begin{bmatrix} e^{\alpha_1 u + j\beta_1 u} & & \\ & \ddots & \\ & & e^{\alpha_n u + j\beta_n u} \end{bmatrix} \qquad (6)$$

where u is any real scalar and $\alpha_i + j\beta_i$ is associated with the ith entry of the diagonal eigenvalues matrix $\Lambda_m$.

Figure 3:
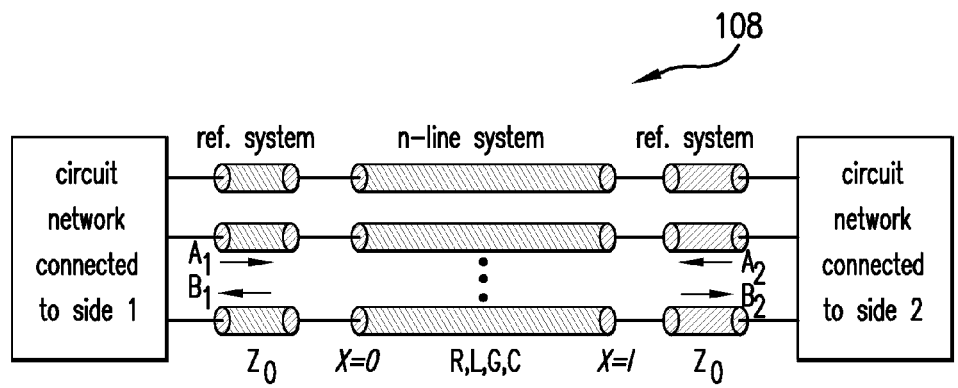
FIG. 3 is a schematic representation of a transmission line system for s-parameter formulation employed in accordance with an exemplary embodiment of the present invention.

By way of illustrative example, the s-parameters of an n-line of interest may be calculated by connecting its ends to lossless reference lines then deriving as illustrated below. The coupled transmission line (n-line) 108 schematically shown in FIG. 3 may be represented using the following relationships:

$$B_1 = S_{11}A_1 + S_{12}A_2 \qquad (7a)$$

$$B_2 = S_{21}A_1 + S_{22}A_2 \qquad (7b)$$

where, A and B denote incident and reflected modal wave vectors, respectively, and $S_{11}$, $S_{12}$, $S_{21}$, and $S_{22}$ denote n×n modal s-parameter matrices; where n represents the number of coupled lines in the n-line of interest.

For a symmetric line structure wherein $S_{12} = S_{21} = S_T$ and $S_{11} = S_{22} = S_R$, the following relationships hold:

$$S_R = T^{-1}[\Gamma - \Psi\Gamma\Psi][I - \Gamma\Psi\Gamma\Psi]^{-1}T \qquad (8a)$$

$$S_T = 2E_0 E^{-1}[I - \Gamma]\Psi[I - \Gamma\Psi\Gamma\Psi]^{-1}T \qquad (8b)$$

and $$\Gamma = [I + EE_0^{-1} Z_0 H_0 H^1 Z^1]^{-1} \cdot [I - EE_0^{-1} Z_0 H_0 H^1 Z^1] \qquad (9a)$$

$$T = [I + EE_0^{-1} Z_0 H_0 H^1 Z^1]^{-1} EE_0^{-1} \qquad (9b)$$

$$\Psi = W(-l) \qquad (9c)$$

where $E_0$, $H_0$, $W_0$, and $Z_0$ represent known characteristic parameters of the reference transmission lines connected to both ends of n-line 108. In addition, l and Z denote the respective length and impedance of the n-line 108, and I denotes its identity matrix of dimension n.

The formulation of s-parameters for a line 108 in this manner is known in the art. Hence, the specific details of such formulation are not important to the present invention, and are not further described herein.

Delay Extraction

Upon formulation of the frequency-domain modal s-parameters, simulator unit 102 actuates computational measure at logic unit 112 to remove the effects of propagation delay intrinsically due to the physical attributes of transmission line 108 from the s-parameters. The effects of propagation delay are extracted in order to significantly reduce the order of the functions produced in subsequent approximation steps.

Extracting the transmission line propagation delay from the parameters $S_R$ and $S_T$ of equations (8a) and (8b) yields smooth s-parameter curves which may be accurately approximated in further processing with a very low order. This in turn reduces inefficiencies in transient simulation, by reducing the number of terms requiring computation.

Figure 4A:
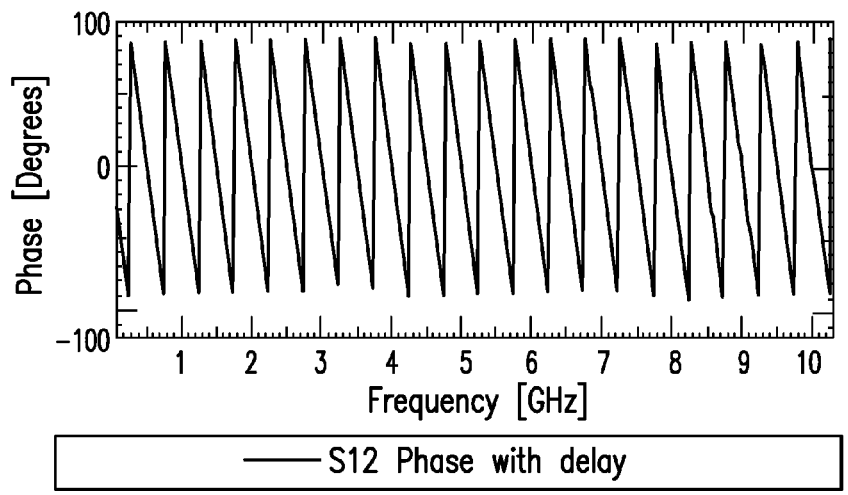
FIGS. 4A-4B are illustrative diagrams showing examples of a phase of an $S_{12}$ curve of a transmission line with delay (FIG. 4A), and a corresponding delay-less curve (FIG. 4B) for the phase of the $S_{12}$ curve.
Figure 4B:
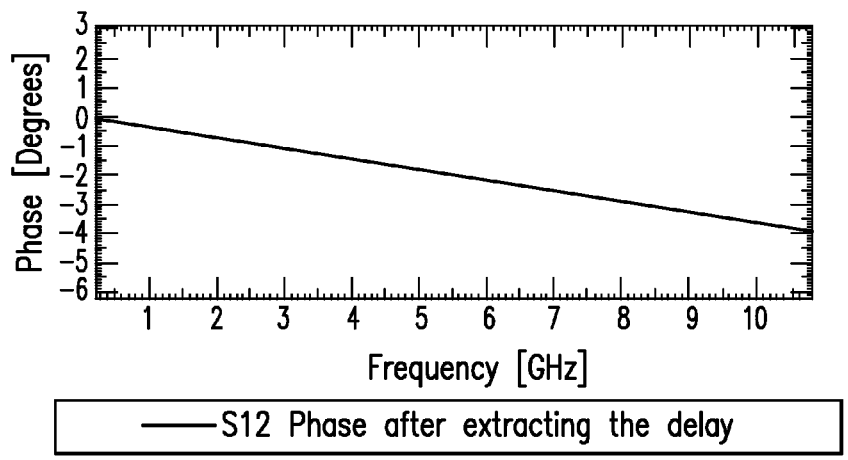

FIGS. 4A-4B provide a graphic illustration of this delay extraction. An exemplary phase curve for the parameter S12 (eq. (7a)) of the transmission line 108 with 1 ns delay, is represented with respect to frequency in FIG. 4A. The same phase curve is shown FIG. 4B, but with the smoothing and simplifying effects due to extraction of the 1 ns delay. In contrast to the original curve of FIG. 4A, delay-less curve of FIG. 4B may be approximated with a relatively low order.

To extract delay, the equation (8a) for $S_R$ is preferably split into two terms as follows:

$$S_R^a = T^{-1}\Gamma[I - \Gamma\Psi\Gamma\Psi]^{-1}T \qquad (10a)$$

$$S_R^b = -T^{-1}\Psi\Gamma\Psi[I - \Gamma\Psi\Gamma\Psi]^{-1}T \qquad (10b)$$

which leaves $S_R^a$ in representing a delay-less term.

Then, a propagation function matrix of the reference system (i.e., $\Psi_o = W_o(-l)$) is used to extract the delay from equations (8b) and (10b) as follows:

$$S'^a_R = S_R^a = T^{-1}\Gamma[I - \Gamma\Psi\Gamma\Psi]^{-1}T \qquad (11a)$$

$$S'^b_R = -T^{-1}\Psi\Gamma\Psi[I - \Gamma\Psi\Gamma\Psi]^{-1}T\Psi_o^{-1}\Psi_o^{-1} \qquad (11b)$$

$$S'_T = 2E_0 E^{-1}[I - \Gamma]\Psi[I - \Gamma\Psi\Gamma\Psi]^{-1}T\Psi_o^{-1} \qquad (11c)$$

where $S'^a_R$, $S'^b_R$, and $S'_T$ represent the delay-less modal s-parameters used for further approximation.

Adaptive Selection of Optimal Modeling Approach

Turning to logic unit 114, simulation unit 102 there operates to determine whether the primary modeling approach, pre-established to be the vector fitting approach 116 in the disclosed embodiment, is in fact the most suitable approach for the given transmission line. The determination is initially made based upon the delay-less s-parameters resulting from logic unit 112. Preferably, the determination is also confirmed by a stability check once the line has been modeled and the simulation conducted (FIG. 6).

Figure 5A:
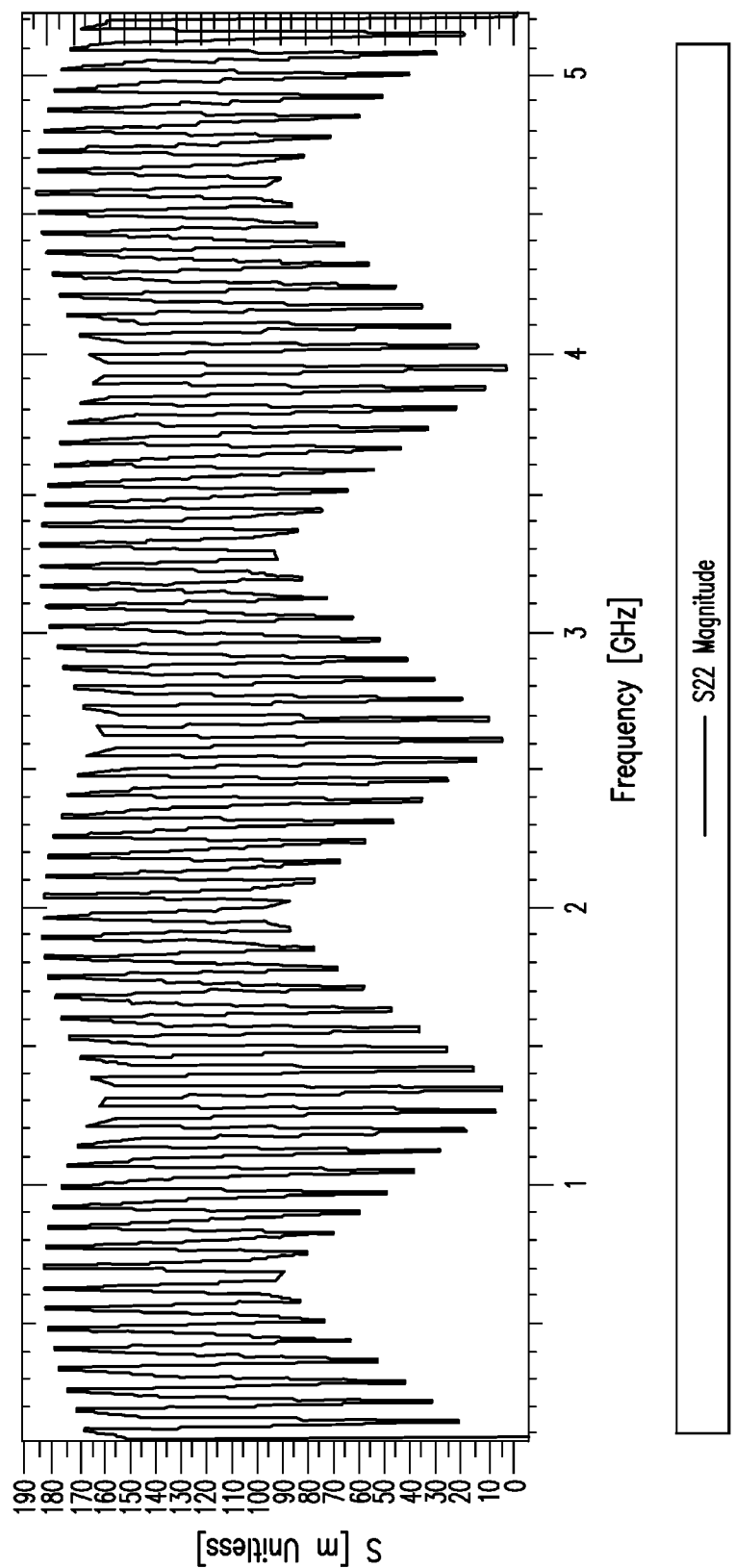
FIGS. 5A-5B are illustrative diagrams showing magnitude and phase of an $S_{22}$ curve for a long transmission line.
Figure 5B:
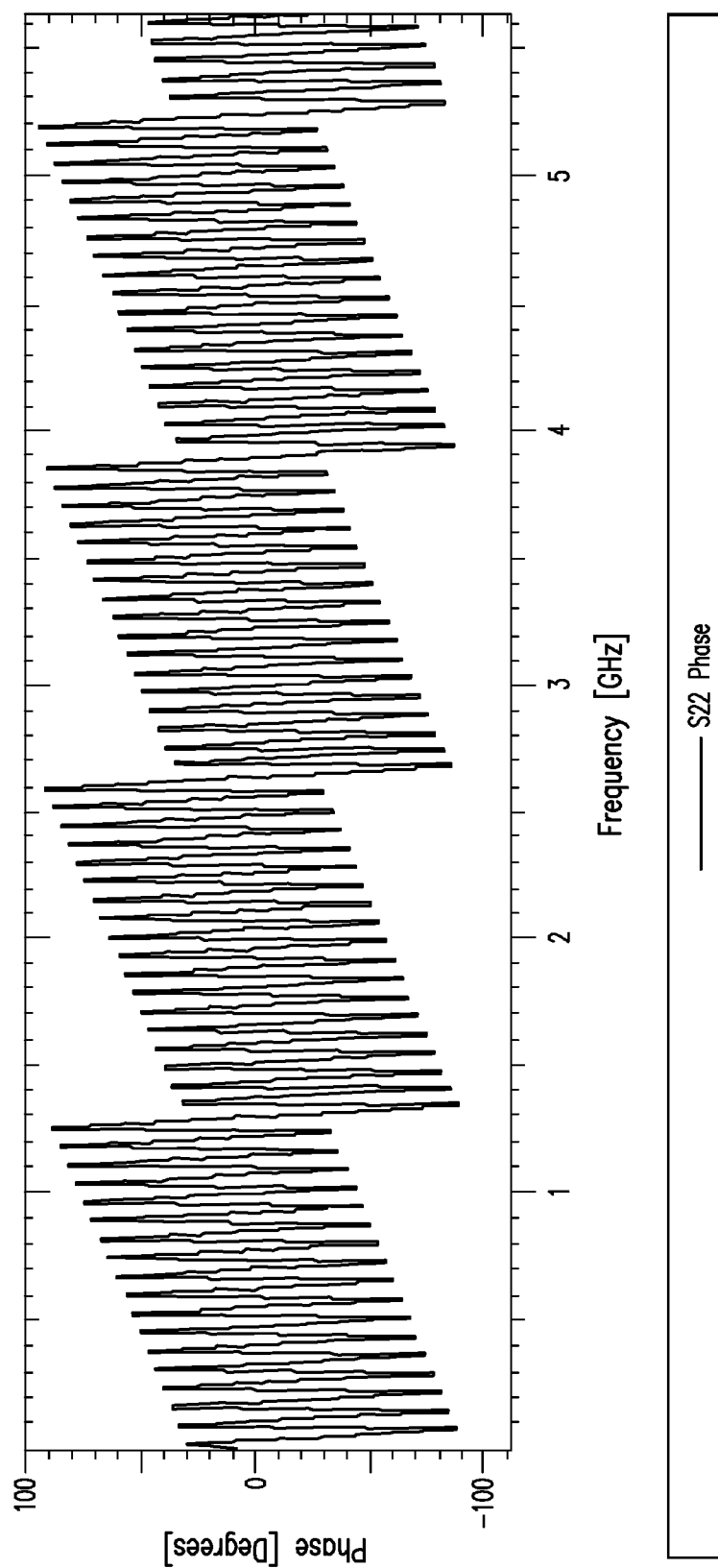

The initial determination preferably includes evaluation of the delay-less s-parameters' frequency-based variation. Referring to FIGS. 5A and 5B, frequency-based curves for the magnitude and/or phase of a given s-parameter may be established, as illustrated. Effective evaluation may be realized by executing various analytical techniques. One example is to analyze such parametric curves illustrated in FIGS. 5A-5B for the degree and/or extent of variation. Where the number of peaks and valleys of a curve, for instance, are observed to exceed a predetermined threshold (greater than 100, for example) over a certain range, the simulation unit 102 determines vector-fitting to be unsuitable, and a secondary modeling approach (such as the convolution based approach at logic unit 118) is considered for further modeling and simulation. If not, processing for vector-fitting at logic unit 116 would proceed.

Parameter data containing excessive peaks and valleys in this regard would be difficult to fit, as it would either lead to an inaccurate model, or require an unduly high order of approximation for adequate compensation. Either accuracy or efficiency would suffer as a result. On the other hand, lesser numbers of peaks and valleys simplifies the approximations required for accuracy, making the curve fitting process of logic unit 116 suitable.

The versatility of this adaptive modeling/simulation makes the flow of processes executed by simulation unit 102 robust. Consulting multiple alternate modeling paths to select the optimal modeling/simulation approach leaves very few cases for which an accurate and stable solution cannot be generated.

Referring to FIG. 6, there is shown a simplified schematic diagram illustrating the flow of processes for an embodiment wherein two alternative modeling approaches are supported in addition to the s-parameter based vector fitting approach 116 described in preceding paragraph. For clarity and brevity, the modeling/simulation processes flowing from and including vector fitting 116 illustrated in FIG. 2A are collectively referenced herein by the "s-element method" shown at logic unit 115. Adaptive selection of the most suitable modeling/ simulation approach is carried out responsive to the initial determination made at logic unit 114, as described in preceding paragraphs. When the s-parameter data is found to be suitable for curve fitting, simulation unit 102 invokes by default the primary s-element method at logic unit 115. The results of transient simulation are thereafter evaluated for stability at logic unit 134—that is, whether or not the transient data converge. If the transients are found to converge, and the results therefore stable, those results are saved at logic unit 136 for further processing and analysis of the transmission line of interest. If the results are found to be unstable (transients fails to converge), a secondary modeling/simulation approach such as the W-element approach known in the art is invoked and executed, as indicated at logic unit 138.

A similar evaluation process occurs once transient simulation is run according to this secondary approach of logic unit 138. At logic unit 140, the results of such transient simulation are also evaluated for stability, much as in logic unit 134. If stable, the results are saved at logic unit 142 and used for further processing and analysis of the transmission line of interest. If these results too are found to be unstable, yet another secondary modeling/simulation approach is invoked and executed. This secondary approach is preferably though not necessarily the same fast convolution approach 118 invoked upon initial determination at logic unit 114 of the given data's unsuitability to vector fitting.

At logic unit 144, the results of transient simulation according to this approach are evaluated for stability. If the results are found to be stable, they are saved for further use at logic unit 146. If, however, these results are also found to be unstable, simulation unit 102 indicates the failure of simulation.

The convergence check to evaluate stability at logic units 134, 140 and 144 are preferably carried out at each given time step, by checking if a solution is found at all the nodes of any non-linear device in the circuit containing the transmission line(s) of interest. In the exemplary embodiment, convergence failure is determined if the number of simulation processing iterations in attempting to find a solution reaches a maximum threshold before an acceptable solution is arrived at (based on a pre-defined error margin). Simulation unit 102 then flags the simulation results to be unstable and proceeds accordingly.

User Interface

Figure 8:
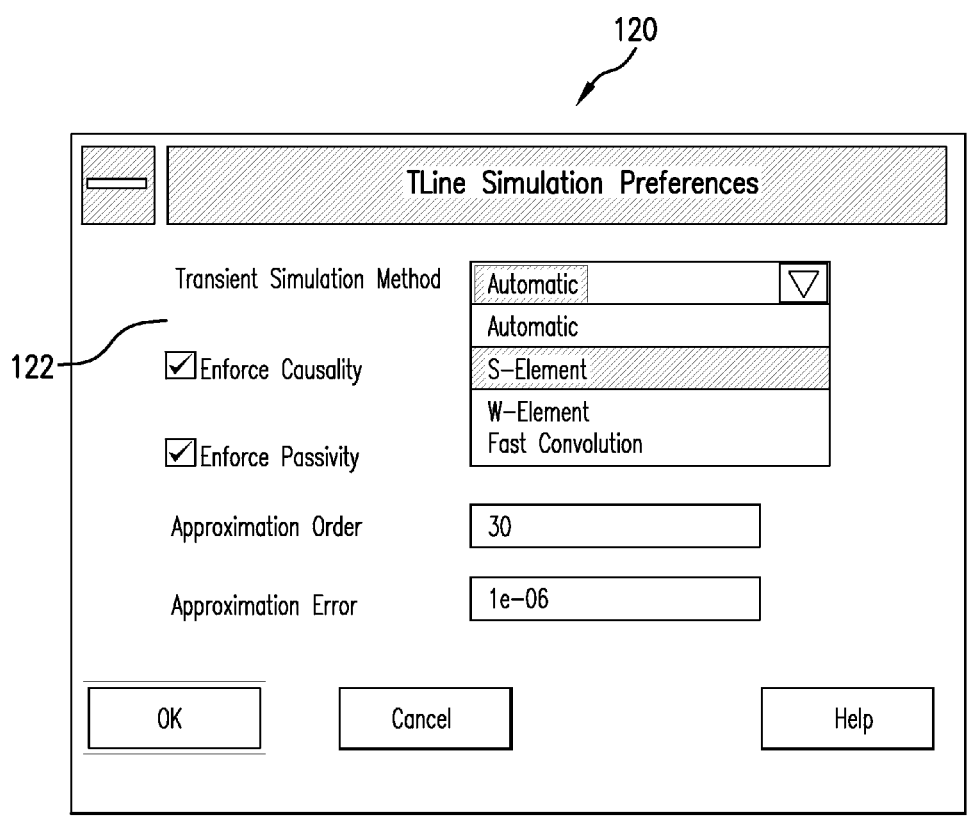
FIG. 8 is a schematic representation of a user interface employed in accordance with an exemplary embodiment of the present invention supporting various transmission line transient simulation settings of the simulation unit.

The various transmission line transient simulation settings may be entered through a user interface 120 operably coupled to simulation unit 102 as illustrated in FIG. 6. The user interface may be implemented as part of a PCB pre- or post-layout analysis tool which interacts with the given circuit simulator system. An example of such user interface 120 includes a graphic user interface screen 122 displayed for a user via any suitable means known in the art. As illustrated in FIG. 8, the graphic user interface screen 122 enables a user to conveniently enter various modeling/simulation settings for configuring simulation unit 102. The "Transient Simulation Method" field in this embodiment offers the option of setting the modeling/simulation approach to "Automatic" selection, or overriding automation selection with any of the individual approaches supported by simulation unit 102, such as: "S-Element," "W-Element," and "Fast Convolution." Setting the "Automatic" option permits the simulation unit 102 to adaptively select from the available approaches to obtain an accurate solution, if any, as described in preceding paragraphs. The causality and passivity enforcement fields in the interface screen 122 permits the user to enable or disable the logic unit 124 shown in FIG. 2A. The remaining fields allow the user to specify the desired approximation order and error in the initial determination logic unit 114 shown in FIGS. 2 and 6.

Preferably, simulation unit 102 permits using different settings for each individual transmission line of interest by supporting options set at the circuit level. When an option is set at the circuit level, it overrides the global setting that is specified via the user interface 120.

Curve Approximation

The delay-less modal s-parameters generated in the logic unit 112 of simulation unit 102 are further subjected to curve approximation in the course of further modeling and simulation. In modeling/simulation approaches heretofore known, a relaxation method (such as shown at block 14 of the W-element approach shown in FIG. 1) is employed to perform approximate curve fitting, even where performed for s-parameters. In accordance with one aspect of the present invention, simulation unit 102 employs the vector fitting approach 116 in place of any relaxation method to carry out the required curve approximation for the given s-parameters. Among other things, this avoids the numerous inaccuracy problems which plague such prior art approaches to curve approximation, particularly in applications involving larger bandwidths and high frequency dependence of data.

The vector fitting approach employed by simulation unit 102 (as the primary modeling approach) serves to generate real as well as complex poles and residues. This is not true with the known relaxation method which models a system only with real coefficients. The vector fitting approach consequently provides a sufficient number of computational terms to accurately characterize a signal, enabling adequate representation of any transmission line system. This broadens the bandwidth of over which the resulting modeling/simulation may be accurately performed.

Vector Fitting

The vector fitting technique is generally known in the art, such as presented in B. Gustavsen and A. Semlyen, "Rational approximation of frequency domain responses by vector fitting," IEEE Trans. Power Delivery, vol. 14, no. 3, pp. 1052-1061, July 1999. Simulator 102 preferably employs a variant of the known technique in logic unit 116 to generate for each delay-less s-parameter curve provided by logic unit 112 a partial fraction representation in the following form:

$$S_{xx} = d + \sum_{i=1}^{r} \frac{k_i}{s-p_i} + \sum_{j=1}^{c}\left(\frac{k_j}{s-p_j} + \frac{k_j^*}{s-p_j^*}\right) \quad (12)$$

where q=r+c is the order of approximation, r is the number of real poles, c is the number of complex conjugate poles, and $k_j^*$ and $p_j^*$ are the complex conjugates of $k_j$ and $p_j$, respectively.

The accuracy and efficiency of the vector fitting approximation strongly depends on the number and location of the starting poles. The known vector fitting technique establishes the location and type of the starting poles to initiate the approximation. In the vector fitting approach 116 employed herein, the number of starting poles is also established initially. This approach serves to enhance accuracy, efficiency, and convergence of the approach.

If, for example, a transmission line system of interest includes a large number of poles, and the approximating computations are launched with a small number of poles, then the vector fitting approach may very well fail to approximate the system without excessive burden in time and computational load. Simply increasing the number of poles and iteratively performing the vector fitting computations until the requisite number of poles for the desired level of approximation accuracy is obtained is fraught with inefficiencies. The vast number of iterations to eventually achieve convergence would prove prohibitive in most cases (especially when the starting guess is far away from the right number of poles).

In the vector fitting approach 116 executed by simulation unit 102, the number of starting poles is initially set in proportion to the sum of peaks and valleys (i.e., local maximum and minimum points) in the s-parameter curves, such as illustrated in FIGS. 5A, 5B. The number of poles is preferably adjusted when the method fails to converge based on the initial number of poles, as illustrated in the schematic flow diagram of FIG. 7 (described in more detail in following paragraphs). Moreover, simulation unit 102 operates in accordance with the present invention even before vector fitting 116 is invoked to determine whether the number of system poles compares favorably to the sum of peaks and valleys observed in the s-parameter curves of FIGS. 5A, 5B. This of course enables simulation unit 102 to determine in advance if the vector fitting computations will produce suitably accurate and stable results.

Figure 7:
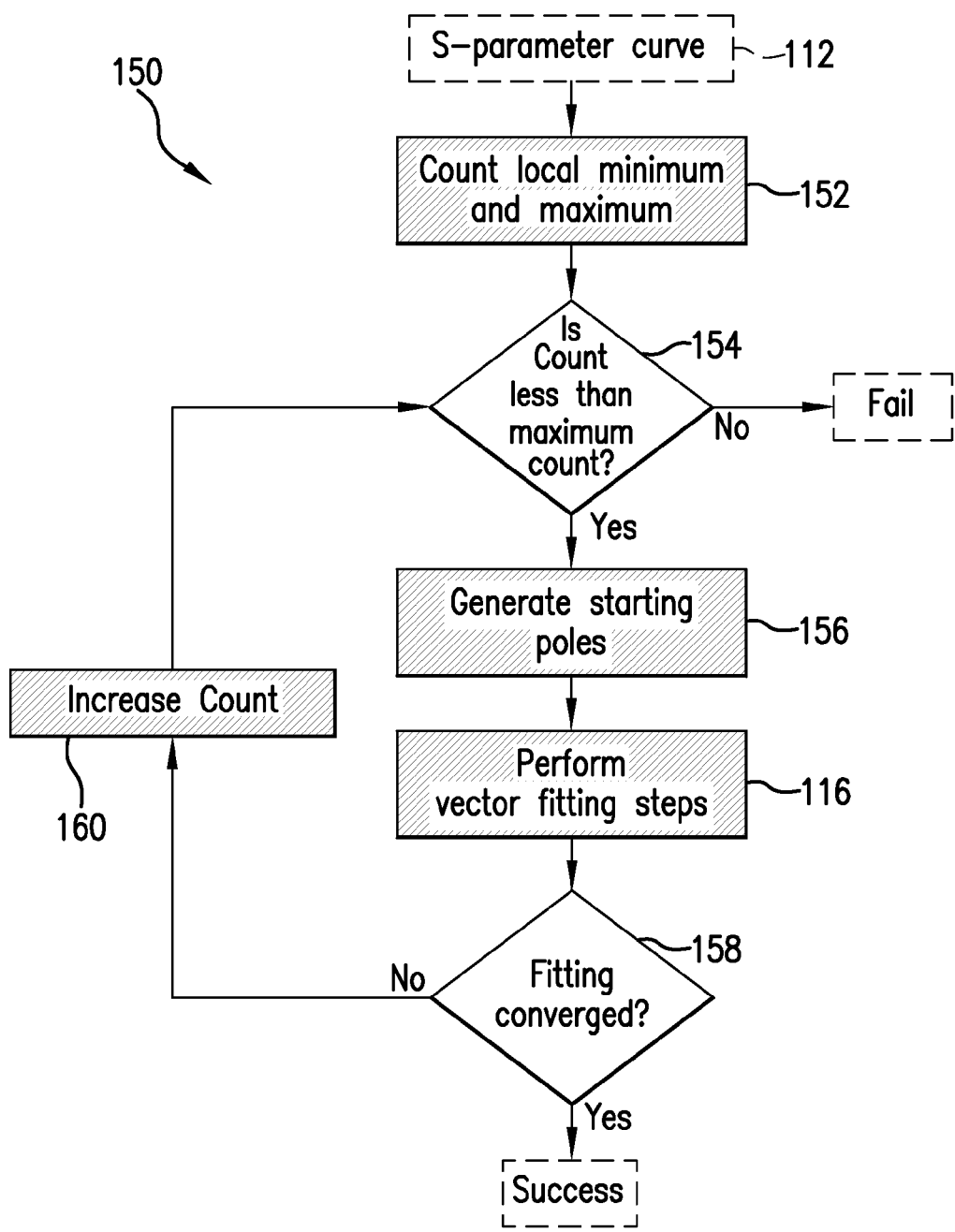
FIG. 7 is a flow diagram schematically illustrating the execution of processes within a portion of a simulation unit employed in accordance with an exemplary embodiment of the present invention, wherein a vector fitting convergence loop is executed.

Referring now to the schematic flow diagram of FIG. 7, simulation unit 102 preferably executes a convergence loop 150 in connection with vector fitting approach 116. The loop 150 is activated once the logic unit 114 determines the suitability of the vector fitting approach upon the count of local minimum and maximum points of the delay-less s-parameter curves (at block 152) being found at block 154 to be within a predetermined maximum threshold. The vector fitting convergence loop 150 generates at block 156 the starting poles for the vector fitting approximation executed at block 116. The number of starting poles is set in proportion to the sum of peaks and valleys counted at block 152. In the example in FIG. 7, the number of starting poles is initially set equal to this counted sum of the s-parameter curves' peaks and valleys. The curve approximations computed at block 116 are then analyzed for convergence at the decision block 158. If a curve approximation is found to converge, the results of the vector fitting process are deemed successful. On the other hand, if the approximation is found not to converge, the flow proceeds to block 154 after the count of poles is increased at block 160. The preceding loop is executed until the vector fitting approximation converges, or the predetermined maximum count threshold is exceeded. In the event the maximum count threshold is exceeded, the vector fitting is deemed to have failed, and a secondary modeling/simulation approach is attempted, as described in preceding paragraphs.

Secondary Curve Approximation Options

Figure 2B:
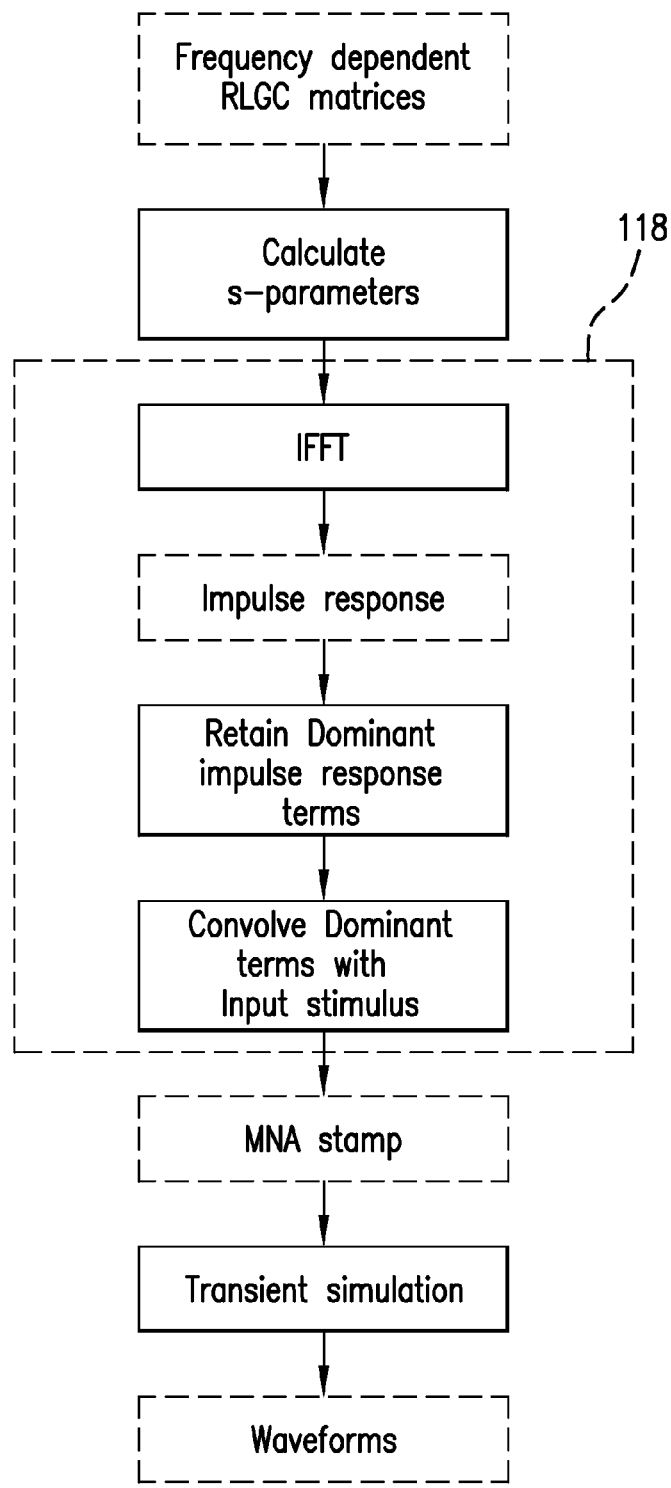
FIG. 2B is a schematic diagram illustrating a flow of processes generally executed in one example of a secondary curve approximation option made available in a system formed in accordance with one exemplary embodiment of the present invention.

In addition to the W-element approach indicated at block 138, a fast convolution based approach 118 is also made available as a secondary option should the primary S-element approach fail to yield sufficiently stable transient simulation. The fast convolution based approach preferably employs Inverse Fast Fourier Transform (IFFT) techniques to transform frequency-dependent s-parameter curves to time-domain representations. For example, an impulse response is effectively obtained for the given transmission line system, after which each frequency-domain s-parameter curve is transformed to a time-domain curve. Then, unlike conventional convolution methods which make use of all points in an impulse response curve, the fast convolution approach 118 retains but a small portion of impulse response points (for example, only those suitably deemed to represent the most dominant terms) to significantly reduce the computational load in subsequent processing. This is practicable because the impulse response of s-parameters tend to die out very quickly, typically leading to very few dominant terms in an impulse response sequence. The reduced impulse response terms are then convolved with the input stimulus of the system to generate an efficient macromodel. An illustrative sequence of processes in an example of this fast convolution approach 118 is illustrated in FIG. 2B.

State Space Formulation

Referring back to FIG. 2A, after the curve approximation is performed by vector fitting unit 116, and a partial fraction representation is obtained for each frequency domain delay-less model s-parameter curve, the real and complex poles and residues (for example, partial fractions) are subjected to time-domain transformation at logic unit 122. Based on the computations in connection with the delay extraction at logic unit 112, the scattering parameter formulation is executed by simulation unit 102 as follows:

$$B_1 = S'_R{}^a A_1 + S'_R{}^b \Psi_o^2 A_1 + S'_T \Psi_o A_2 \quad (13a)$$

$$B_2 = S'_T \Psi_o A_1 + S'_R{}^a A_2 + S'_R{}^b \Psi_o^2 A_2 \quad (13b)$$

The time domain representations for equations (13a) and (13b) are given by:

$$b_1(t) = s'_r{}^a(t) * a_1(t) + s'_r{}^b(t) * a_1(t-2\tau) + s'_t(t) * a_2(t-\tau) \quad (14a)$$

$$b_2(t) = s'_t(t) * a_1(t-\tau) + s'_r{}^a(t) * a_2(t) + s'_r{}^b(t) * a_2(t-2\tau) \quad (14b)$$

where $b_1$, $b_2$, $a_1$, and $a_2$ denote the time-domain modal vectors of $B_1$, $B_2$, $A_1$, and $A_2$, respectively; and, $s'_r{}^a$, $s'_r{}^b$, and $s'_t$ denote the time-domain s-parameter matrices associated with $S'_R{}^a$, $S'_R{}^b$, and $S'_T$, respectively. The symbol * denotes a convolution operation in the time-domain, while $\tau$ and $2\tau$ represent the delay extracted at block 112, which are related to $\Psi_o$ and $\Psi_o^2$, respectively. For simplicity, equations (14A) and (14B) are alternatively expressed as follows:

$$b(t) = S(t) * a(t) \quad (15)$$

Voltage v(t) and current i(t) are related to a(t) and b(t) according to the following equations:

$$a(t) = \frac{1}{2\sqrt{Z_0}}(v(t) + Z_0 i(t)) \quad (16a)$$

$$b(t) = \frac{1}{2\sqrt{Z_0}}(v(t) - Z_0 i(t)) \quad (16b)$$

A corresponding state space representation wherein a(t) and b(t) map to u(t) and y(t) may be expressed, respectively, as follows:

$$\frac{dx(t)}{dt} = Ax(t) + Bu(t) \quad (17a)$$

$$y(t) = Cx(t) + Du(t) \quad (17b)$$

For example, the x, B, C vectors and A matrix for a system with real poles $(p_1 p_2 \ldots p_q)$ and residues $(k_1, k_2, \ldots, k_q)$ may be defined as follows:

$$x = [x_1 x_2 \ldots x_q]^T \quad (18a)$$

$$B = [1 1 \ldots 1]^T \quad (18b)$$

$$C = [k_1 k_2 \ldots k_q] \quad (18c)$$

$$A = \begin{bmatrix} p_1 & 0 & 0 & 0 \\ 0 & p_2 & 0 & 0 \\ 0 & 0 & \ddots & 0 \\ 0 & 0 & 0 & p_q \end{bmatrix} \quad (18d)$$

The discrete time-domain solution for the system of equations (17a) and (17b) is then given by:

$$x[k+1] = A_d x[k] + B_d u[k] \quad (19a)$$

$$y[k] = C_d x[k] + D_d u[k] \quad (19b)$$

where:

$$A_d = e^{AT} \quad (20a)$$

$$B_d = \int_0^T e^{At} dt \quad (20b)$$

$$C_d = C \quad (20c)$$

$$D_d = D \quad (20d)$$

Passivity Assessment and Enforcement

The logic unit 124 of FIG. 2A, is executed by simulation unit 102 to assess and, where necessary, enforce the passivity of the given transmission line system's representation. A transmission line system is necessarily passive. That is, it does not itself generate energy during use. To preserve accuracy and stability, therefore, it is necessary to ensure that a transmission line system's macromodel likewise remains passive. A transient solution (one which actually converges) requires as much.

Various techniques for ensuring passivity in this regard are known in the art, and any suitable technique may be employed in logic unit 124. In the disclosed embodiment, passivity is enforced by perturbing the residues of the given model, preferably by employing a Linear equality-constrained least squares (LSE) based technique. It is possible for numerical errors incurred during the approximation process to cause non-passivity in the partial fraction representations (Eq. (12)) obtained by vector fitting. Simulation unit 102 would execute logic unit 124 in that case to recognize the non-passivity then remedy the situation by appropriate perturbation of the residues. This approach helps to preserve stability in the transient simulation to follow.

Passivity of the transmission line system is preferably assessed by first constructing a Hamiltonian matrix M as known in the art, based on the state-space model (Eq. 17a and 17b) obtained at logic unit 122:

$$M = \begin{bmatrix} A - BR^{-1}D^T C & -BR^{-1}B^T \\ C^T S^{-1} C & -A^T + C^T DR^{-1}B^T \end{bmatrix} \quad (21)$$

where, $$R = (D^T D - I) \text{ and } S = (DD^T - I) \quad (22)$$

wherein,

A denotes a matrix established as a function of the poles in the partial fraction representation $S_{xx}$ of Eq. 12;

B denotes a vector wherein each real pole is represented by a 1 entry, and each complex conjugate pole is represented by a [2,0] entry;

C denotes a matrix established as a function of the residues in the partial fraction representation $S_{xx}$ of Eq. 12;

D denotes a matrix established based upon the scalar d in the partial fraction representation $S_{xx}$ of Eq. 12;

$D^T$ denotes the transpose of matrix D; and,

I denotes an Identity matrix.

The transmission line system is determined by logic unit 124 to be passive if the matrix M includes no eigenvalues which are purely imaginary. In that case, passivity may be enforced by iteratively perturbing the residues matrix C in a suitable manner having negligible effect on the accuracy of the approximated partial fractions. The iterative perturbation is continued until the matrix M yields no eigenvalues which are purely imaginary. At that point, the system is deemed passive. Residues may be perturbed as follows:

$$C' = C + \Delta C \quad (23)$$

As a result, the s-parameter matrix changes as follows:

$$S'(\omega) = S(\omega) + \Delta S(\omega) \quad (24)$$

where:

$$\Delta S(\omega) = \Delta C(j\omega I - A)^{-1} B \quad (25)$$

Based on equations (24) and (25), a linear equality-constrained least squares (LSE) problem is formulated which minimizes $\Delta S$ subject to a $\Delta C$ that eliminates the purely imaginary eigenvalues of matrix M as illustrated below:

$$\text{minimize} \|z - V^* x\|^2 \text{ subject to } G^* x = l \quad (26)$$

where:

z is a 0 vector;

V is a matrix that is a function of the $(j\omega I - A)^{-1} B$ terms in Eq. 25;

x is a vector of the unknown $\Delta C$ values to be found;

G is a matrix that relates $\Delta C$ to the eigenvalues of M;

l is a vector that captures the difference between the eigenvalues of the perturbed and unperturbed M; and
I is an identity matrix Logic unit 124 executes equation 26 in iterative manner until a solution is found. Based on the solution of the equation 26, the passivity-enforced discrete time-domain system is given by:

$$x[k+1]=A_d x[k]+B_d u[k] \quad (27a)$$

$$y[k]=C'_d x[k]+D_d u[k] \quad (27b)$$

MNA Stamp and Transient Simulation

From logic unit 124 in FIG. 2A, the process flows in simulation unit 102 to logic unit 126, where the propagation delay (previously extracted by logic unit 112) is re-inserted into the time-domain representations. Modified Nodal Approach (MNA) stamps are then generated in logic unit 128 to prepare for transient simulation in logic unit 130. Any suitable circuit simulator known in the art may be employed in logic unit 130. One such conventional circuit simulator is SPICE (Simulation Program with Integrated Circuit Emphasis), a general-purpose analog electronic circuit simulator widely used in IC and board-level design to check the integrity of circuit designs and to predict circuit behavior.

Figure 9:
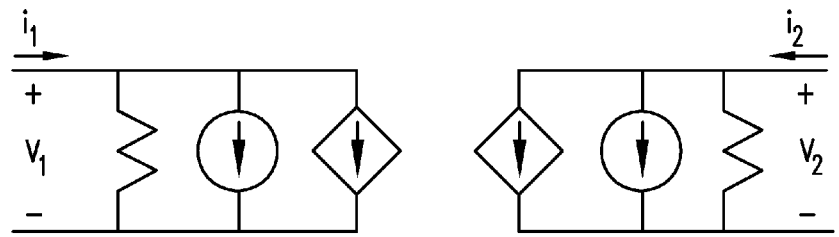
FIG. 9 is a schematic representation illustrating an example of an equivalent SPICE circuit modeling a single transmission line.

According to equations 16, 20, and 27, a passive time-domain circuit stamp may be obtained which may be compatible for use directly in the particular transient simulation employed in logic unit 130. Where a SPICE simulator is employed, for example, the corresponding time-domain matrix representation for the resulting model may expressed as follows:

$$i(t_{n+1})=G_{eq}v(t_n)+I_{eq} \quad (28)$$

where $t_n$ and $t_{n+1}$ denote the current and next time steps, respectively, $G_{eq}$ denotes an equivalent conductance matrix, and $I_{eq}$ denotes an equivalent current vector. An equivalent circuit for a corresponding single transmission line is illustrated in FIG. 9.

Figure 12:
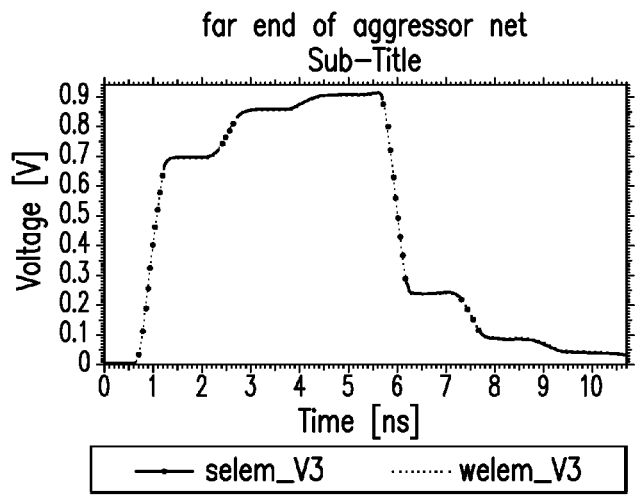
FIG. 12 is a comparative waveform diagram of the voltage obtained at a far end of the aggressor net in the circuit shown in FIG. 10 respectively employing S-element and W-element techniques.
Figure 13:
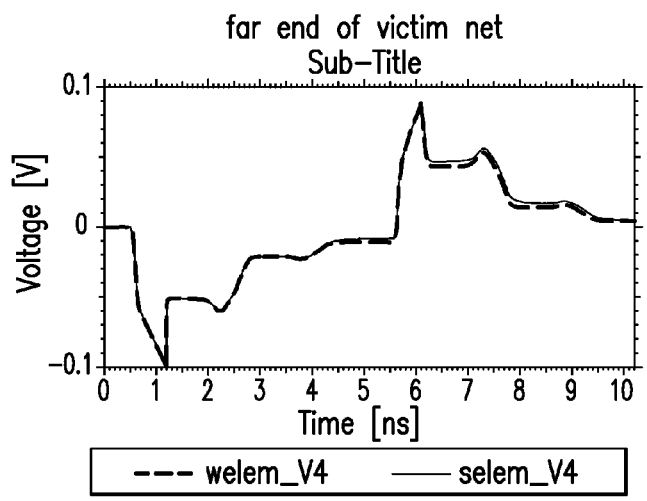
FIG. 13 is a comparative waveform diagram of the voltage obtained at a far end of the victim net in the circuit shown in FIG. 10 respectively employing S-element and W-element techniques.
Figure 14:
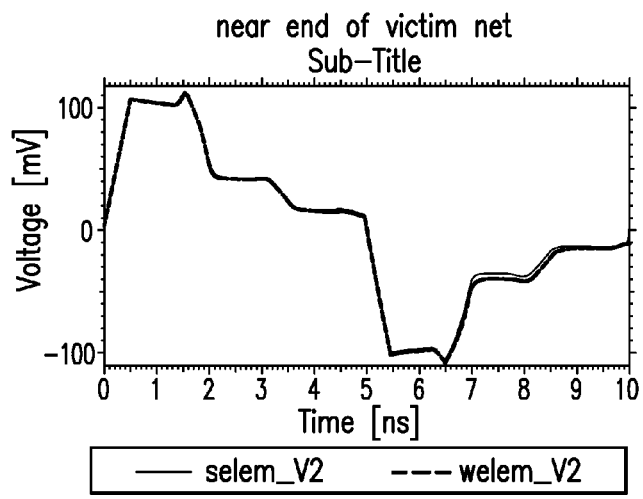
FIG. 14 is a comparative waveform diagram of the voltage obtained at a near end of the victim net in the circuit shown in FIG. 10 respectively employing S-element and W-element techniques.

The results of transient simulations generated in block 130 are typically output in the form of waveforms, examples of which are illustratively shown in FIGS. 12-14. The generated transient simulation results may be supplied to the decision block 134 of FIG. 6 for convergence testing, and/or they may be output for use in further analysis, processing, and optimization.

EXAMPLES

Figure 10:
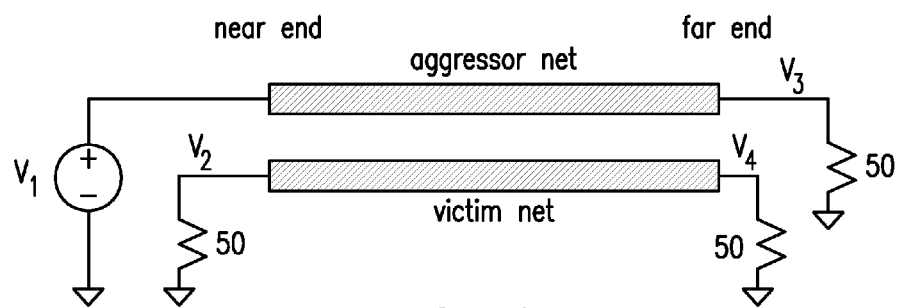
FIG. 10 is a schematic representation of a transmission line circuit example subjected to validation testing.

Numerous modeling/simulation cases have been run to validate the subject method and system. Among them, validation cases were run for the vector fitting approach (initiated by logic unit 116 as shown in FIGS. 2 and 6) to modeling/simulation. An equivalent circuit representing a coupled microstrip line example is schematically illustrated in FIG. 10. In this particular example, the line includes two lines, each 5 inches in length, and is characterized by frequency dependent RLGC data with 50 GHz bandwidth. Transient simulation was performed twice for validation purposes, once with the line modeled in accordance with an embodiment (referenced herein as the 's-element' method) of the present invention disclosed herein, and once with the line modeled in accordance with a known W-element method.

Figure 11:
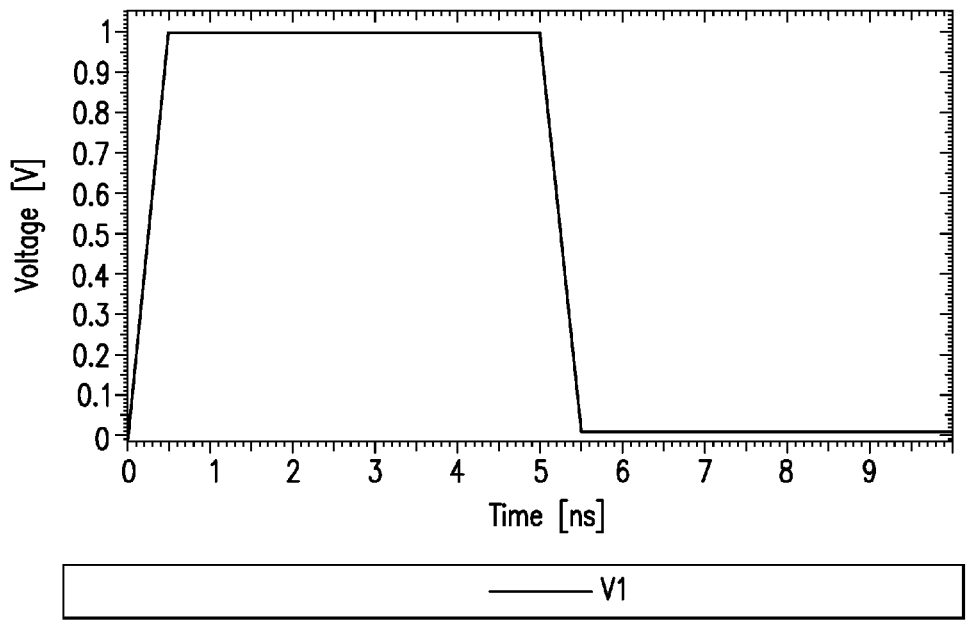
FIG. 11 is a waveform diagram of a pulse voltage input applied at a near end of the aggressor net in the circuit shown in FIG. 10.

FIG. 11 illustrates the reference input waveform $V_1$ applied (as represented by the voltage source) to the line's circuit of FIG. 10. The waveform $V_1$ shown defines a pulse having rise and fall times $T_{rise}=T_{fall}=0.5$ ns, a pulse width $T_{width}=4.5$ ns, and a pulse period $T_{period}=10$ ns. The pulse is applied at a near end of the aggressor net shown in FIG. 10.

Representative transient simulation results for both cases are shown in FIGS. 12-14. The voltage waveforms resulting from both transient simulations closely coincide. Compared to the prevalent prior art W-element approach, the s-element embodiment of the present invention delivers essentially the same, if not greater, level of accuracy—but with significantly greater computational efficiency. There is no appreciable loss of accuracy by adaptively selecting the s-element approach for modeling and simulation, where the s-parameters of a given transmission line system permit, as described in preceding paragraphs.

In FIG. 12, the s-element method results and w-element method results at a far end of the aggressor net of FIG. 10 are concurrently shown. In FIG. 13, the s-element method and w-element method results at a far end of the victim net of FIG. 10 are concurrently shown. In FIG. 14, the s-element method and w-element method results at the near end of the victim net of FIG. 10 are concurrently shown. In all cases, the resulting waveforms closely coincide, deviating at most by a few milliseconds at some points.

The subject simulator system 100 may be used to accurately analyze a selected net in both pre- and post-layout tools. An example of use in a post-layout application is illustrated in FIGS. 15-18. In this example, a PCB design layout is graphically shown in FIG. 15, where the net selected for analysis is highlighted by broken line representation. The circuit topology for this highlighted net containing two distinct microstrip line components is shown in FIG. 16. From left to right, this circuit contains a driving I/O component (U1.2), a 2200 MIL microstrip line component (MS3), a 50 ohm resistor component (R1), a 400 MIL microstrip line component (MS2), and a receiving I/O component (U2.13).

Figure 17:
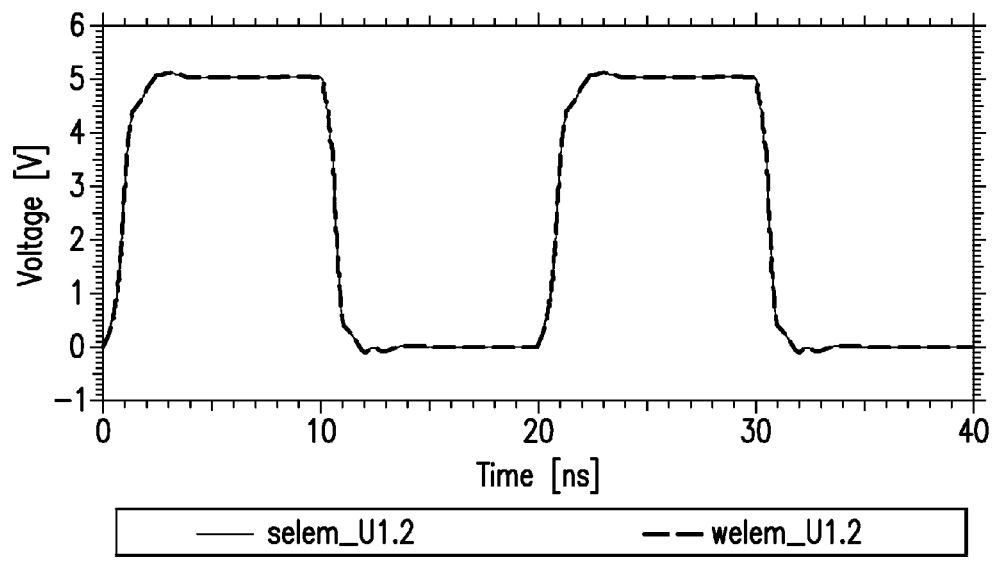
FIG. 17 is a comparative waveform diagram of the voltage measured at the U1.2 driver of FIG. 16 respectively employing S-element and W-element techniques.
Figure 18:
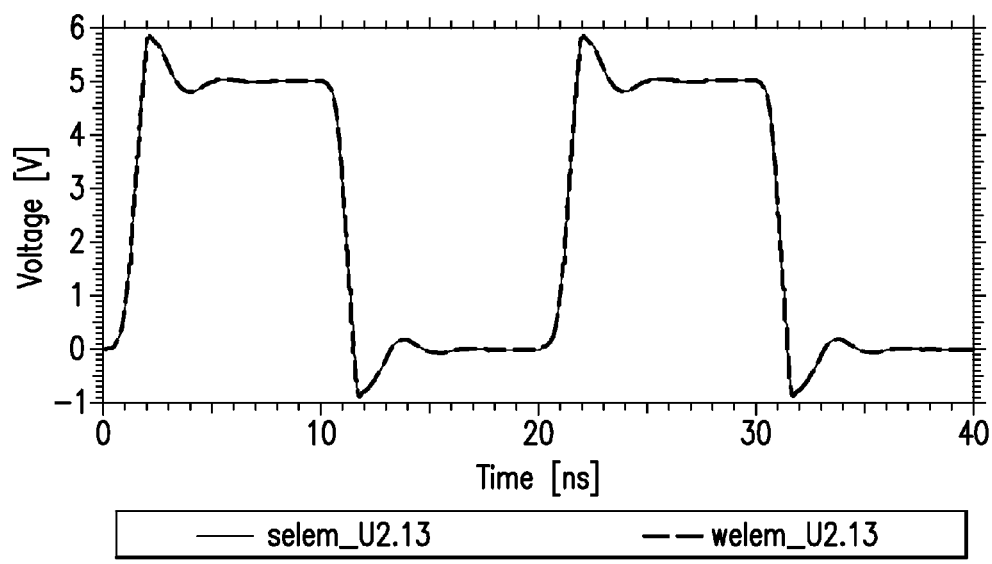
FIG. 18 is a comparative waveform diagram of the voltage measured at the U2.13 receiver of FIG. 16 respectively employing S-element and W-element techniques; and, FIG. 19 is a schematic diagram illustrating an inter-coupling of computing hardware for programmably implementing an exemplary embodiment of the present invention.

This circuit was also simulated twice. In the first run, the subject s-element embodiment was selected to model the two transmission lines of FIG. 16 for simulation. In the second run, the w-element approach was used to model and simulate the transmission lines. As shown in FIGS. 17 and 18, the results from the two cases again coincide very closely, at both the driver and receiver ends of the circuit.

The method and system disclosed herein are thus found, among other things, to be comparable in accuracy to prior art approaches, such as the w-element method, but with computational complexity on the order of O(n), n being proportional to the number of simulation time steps. The s-element method, employed in the disclosed embodiment as the primary approach to modeling, uses bounded s-parameters to represent the transmission line system. It preferably uses vector fitting to model the line using real and complex poles and residues in order to obtain a more accurate macromodel than for instance the w-element approach. The S-element method, unlike the W-element and other such existing methods, preserves the causality as well as passivity of the resulting macromodel. Consequently, subsequent simulation results are stable and more accurate. The simulator system is robust in operation, as it automatically seeks and supports multiple alternate modeling paths should the s-element method fail to produce a sufficient model.

Figure 19:
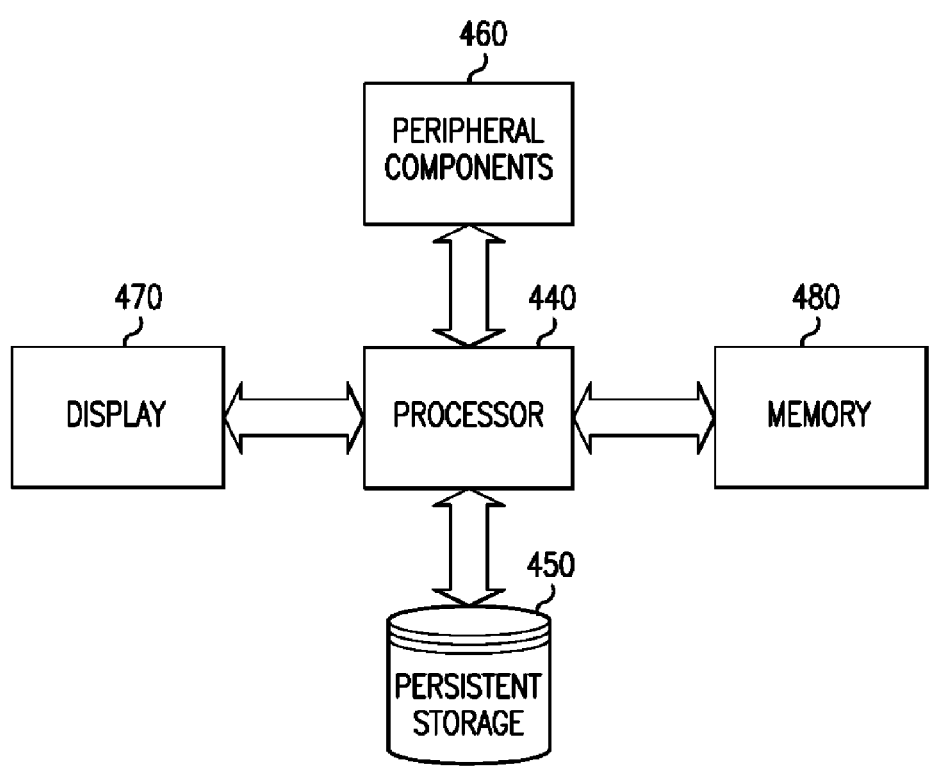

Various aspects of the present invention may be carried out in functional modules suitably implemented in computing hardware such as those illustrated for example in FIG. 19. System 100 preferable implements a suitable structure on, for example, a persistent storage subsystem 450, for retaining data so as to be retrieved, modified, or otherwise processed during system operation.

User interface 120 may be implemented through processor instructions stored in memory system 480 and executed by a suitable processor 440. The user interface 120 preferably includes a graphical user interface established on a display 470, conveniently monitor and, where necessary, interactively control certain aspects of system operation and/or utilization. Certain peripheral components 460 of any suitable type known in the art may be coupled to processor 440 to support system operation according to the particular requirements of the intended application.

Simulation unit 102 and field solver 106 are preferably implemented through processor instructions stored in memory subsystem 480 and executable by processor 440. Control of (or operational interface with) the display 470 and peripheral components 460 is preferably also implemented through processor instructions stored in memory system 480 and executable by processor 440; although the present invention is not limited to any specific implementation of the various units, components, and subsystems making up system 100.

Although this invention has been described in connection with specific forms and embodiments thereof, it will be appreciated that various modifications other than those discussed above may be resorted to without departing from the spirit or scope of the invention as defined in the appended claims. For example, functionally equivalent elements may be substituted for those specifically shown and described, certain features may be used independently of other features, and in certain cases, particular locations of the elements may be reversed or interposed, all without departing from the spirit or scope of the invention as defined in the appended claims.

What is claimed is:

1. A method for adaptively modeling and simulating high speed response of a transmission line, comprising:
    establishing a processor system including a simulation unit;
    establishing a plurality of curve approximation options for modeling the transmission line;
    actuating said simulation unit to selectively execute one of said curve approximation options in response to a corresponding determination of suitability based upon predetermined criteria to generate a macromodel of the transmission line, wherein:
        said predetermined criteria includes frequency-domain modal scattering parameters obtained for the transmission line according to frequency-dependent data characterizing the transmission line; and,
        a primary one of said curve approximation options is executed upon a positive determination of suitability, and a secondary one of said curve approximation options is alternatively executed upon a negative determination of suitability; and,
    executing transient simulation upon said macromodel of the transmission line.

2. The method as recited in claim 1, wherein said determination of suitability includes:
    initially defining a set of said frequency-domain modal scattering parameters for the transmission line based on said frequency-dependent data characterizing the transmission line;
    extracting from said frequency-domain modal scattering parameters a propagation delay effect of the transmission line, thereby generating delay-less modal scattering parameter curves for the transmission line; and,
    determining in response to said frequency-domain delay-less modal scattering parameter curves, either the positive or negative determination of suitability for a predefined primary one of said curve approximation options for modeling.

3. The method as recited in claim 2, wherein said primary curve approximation option includes:
    generating a partial fraction representation of each said frequency-domain delay-less modal scattering parameter curve, the partial fraction representation being defined by a set of real and complex poles and residues;
    transforming said partial fraction representations of said frequency-domain delay-less modal scattering parameter curves to time-domain, thereby generating a time-domain state space model of the transmission line;
    assessing and preserving the passivity of said time-domain state space model of the transmission line;
    inserting said propagation delay effect of the transmission line into said time-domain state space model to generate corresponding time-domain state space model formulations; and,
    generating and applying a Modified Nodal Analysis (MNA) stamp based on said time-domain state space model formulations.

4. The method as recited in claim 3, wherein said primary curve approximation executes a vector fitting approximation to generate said partial fraction representation of each said frequency-domain delay-less modal scattering parameter curve.

5. The method as recited in claim 1, wherein said curve approximation options include a convolution based method.

6. The method as recited in claim 2, wherein said determination of suitability includes comparative analysis based on a count of maximum and minimum points within a portion of said frequency-domain delay-less modal scattering parameter curves, said primary curve approximation being selectively executed upon said count being less than a predetermined maximum count value.

7. The method as recited in claim 6, wherein said primary curve approximation executes a vector fitting approximation to generate said partial fraction representation of each said frequency-domain delay-less modal scattering parameter curve; and, a number of starting poles for said vector fitting approximation is established in proportional relation to said count of maximum and minimum points of said frequency-domain delay-less modal scattering parameter curves.

8. The method as recited in claim 7, wherein said simulation unit is actuated to execute a convergence loop including:
    checking for convergence of said partial fraction representations resulting from said vector fitting approximation; and,
    upon failure of said convergence check adjusting said number of said starting poles and repeating said vector fitting approximation based thereon.

9. The method as recited in claim 1, further comprising:
    analyzing an output of said transient simulation for stability of transient simulation results; and,
    upon indication of unstable results from said analysis, alternatively executing another of said curve approximation options and repeating transient simulation upon an alternate macromodel of the transmission line obtained thereby.

10. The method as recited in claim 9, wherein a W-element method is selected as first alternatively executed curve approximation option upon an indication of unstable results from transient simulation in response to said primary curve approximation option; and, a convolution method is selected as a second alternatively executed curve approximation option upon an indication of unstable results from transient simulation in response to said W-element method.

11. The method as recited in claim 10, wherein said frequency-dependent data characterizing the transmission line include frequency-dependent per-unit-length RLGC matrices.

12. The method as recited in claim 11, wherein the transmission line of interest is represented by:

$$B_1 = S_{11} \cdot A_1 + S_{12} \cdot A_2,$$

$$B_2 = S_{21} \cdot A_1 + S_{22} \cdot A_2,$$

wherein $A_1$ and $A_2$ denote incident modal wave vectors; $B_1$ and $B_2$ denote reflected modal wave vectors at predetermined parts of the transmission line; $S_{11}$, $S_{12}$, $S_{21}$, and $S_{22}$ denote n×n scattering parameter matrices; and, n denotes the number of coupled lines in the transmission line.

13. The method of claim 12, wherein for a symmetric transmission line structure, $S_{12}=S_{21}=S_T$, and $S_{11}=S_{22}=S_R$, scattering parameter matrices $S_R$ and $S_T$ are calculated according to:

$$S_R = T^{-1}[\Gamma - \Psi\Gamma\Psi][I - \Gamma\Psi\Gamma\Psi]^{-1}T,$$

$$S_T = 2E_0E^1[I - \Gamma]\Psi[I - \Gamma\Psi\Gamma\Psi]^{-1}T,$$

and wherein $$\Gamma = [I + EE_0^{-1}Z_0H_0H^{-1}Z^1]^{-1} \cdot [I - EE_0^{-1}Z_0H_0H^{-1}Z^1],$$

$$T = [I + EE_0^{-1}Z_0H_0H^{-1}Z^1]^{-1}EE_0^{-1},$$

$$\Psi = W(-l)$$

where $E_0$ denotes a voltage transformation matrix; E denotes a voltage transformation of the transmission line; $H_0$ denotes a current transformation matrix; H denotes a current transformation of the transmission line; W denotes a complex propagation matrix of the transmission line; $Z_0$ denotes a modal impedance matrix; l denotes a length; Z denotes an impedance of the transmission line; and, I denotes an identity matrix of dimension n.

14. The method as recited in claim 13, wherein said delay-less modal scattering parameter curves are calculated according to:

$$S'^a_R = S^a_R = T^{-1}\Gamma[I - \Gamma\Psi\Gamma\Psi]^{-1}T,$$

$$S'^b_R = -T^{-1}\Psi\Gamma\Psi[I - \Gamma\Psi\Gamma\Psi]^{-1}T\Psi_o^{-1}\Psi_o^{-1},$$

$$S'_T = 2E_0E^{-1}[I - \Gamma]\Psi[I - \Gamma\Psi\Gamma\Psi]^{-1}T\Psi_o^{-1},$$

where, $S'^a_R$, $S'^b_R$, and $S'_T$ denote said delay-less modal scattering parameters.

15. The method as recited in claim 3, wherein said partial fraction representation is defined according to:

$$S_{xx} = d + \sum_{i=1}^{r} \frac{k_i}{s - p_i} + \sum_{j=1}^{c} \left( \frac{k_j}{s - p_j} + \frac{k_j^*}{s - p_j^*} \right)$$

where, d denotes a characteristic scalar value; r denotes the number of real poles; c denotes the number of complex conjugate pairs; $k_i$ and $p_i$ denote the ith residue and pole, respectively; and, $k_j^*$ and $p_j^*$ denote the complex conjugates of $k_j$ and $p_j$, respectively.

16. The method as recited in claim 14, wherein said time-domain state space model formulation is defined according to:

$$b_1(t) = s'^a_r(t) * a_1(t) + s'^b_r(t) * a_1(t - 2\tau) + s'_t(t) * a_2(t - \tau),$$

$$b_2(t) = s'_t(t) * a_1(t - \tau) + s'^a_r(t) * a_2(t) + s'^b_r(t) * a_2(t - 2\tau),$$

where, t denotes time $b_1$, $b_2$, $a_1$, and $a_2$ denote time-domain modal vectors of $B_1$, $B_2$, $A_1$, and $A_2$, respectively; $s'^a_r$, $s'^b_r$, and $s'_t$ denote time-domain scattering parameter matrices associated with $S'^a_R$, $S'^b_R$, and $S'_T$, respectively; and, $\tau$ and $2\tau$ represent extracted delays dependent upon to $\Psi_o$ and $\Psi_o^2$, respectively.

17. The method as recited in claim 15, wherein in said assessing and preserving passivity includes establishing a Hamiltonian matrix M based on said state-space model, according to:

$$M = \begin{bmatrix} A - BR^{-1}D^TC & -BR^{-1}B^T \\ C^TS^{-1}C & -A^T + C^TDR^{-1}B^T \end{bmatrix}$$

where, $$R = (D^TD - I) \text{ and } S = (DD^T - I)$$

wherein the transmission line is determined passive if M has no purely imaginary eigenvalues, and wherein:

A denotes a matrix established as a function of the poles in said partial fraction representation $S_{xx}$;

B denotes a vector wherein each real pole is represented by a 1 entry, and each complex conjugate pole is represented by a [2,0] entry;

C denotes a matrix established as a function of the residues in said partial fraction representation $S_{xx}$;

D denotes a matrix established based upon the scalar d in said partial fraction representation $S_{xx}$;

$D^T$ denotes the transpose of matrix D; and,

I denotes an Identity matrix.

18. The method as recited in claim 17, wherein said passivity is preserved by iteratively perturbing a residues matrix C until none of the eigenvalues of said Hamiltonian matrix M remains purely imaginary, and wherein a linear equality-constrained least squares (LSE) problem is formulated and solved to eliminate the purely imaginary eigenvalues of M.

19. The method as recited in claim 3, wherein said MNA stamp is defined according to:

$$i(t_{n+1}) = G_{eq}v(t_n) + I_{eq}$$

where $i(t_{n+1})$ denotes a value of current; $v(t_n)$ denotes a value of voltage; $t_n$ and $t_{n+1}$ denote consecutive time steps, respectively; $G_{eq}$ denotes an equivalent conductance matrix; and, $I_{eq}$ denotes an equivalent current vector.

20. A system for adaptive modeling and high speed response simulation of a transmission line, comprising:

a simulation modeling unit executed in at least one processor maintaining a plurality of curve approximation options for modeling the transmission line, wherein:

said simulation modeling unit selectively executes one of said curve approximation options in response to a corresponding determination of suitability based upon predetermined criteria to generate a macro-model of the transmission line, said predetermined criteria including frequency-domain modal scattering parameters obtained for the transmission line according to frequency-dependent data characterizing the transmission line; and, said simulation modeling unit executes a primary one of said curve approximation options upon a positive determination of suitability, said simulation modeling unit alternatively executing a secondary one of said curve approximation options upon a negative determination of suitability; and, a transient simulator unit coupled to said simulation modeling unit simulating the response of the transmission line upon said macromodel thereof.

21. The system as recited in claim 20, wherein said simulation modeling unit includes:

a scattering parameters formulation unit executable to define a set of said frequency-domain modal scattering parameters for the transmission line based on said frequency-dependent data;

a propagation delay extracting unit coupled to said scattering parameters formulation unit executable to extract from said frequency-domain modal scattering parameters a propagation delay effect of the transmission line, and thereby generate delay-less modal scattering parameter curves for the transmission line; and, a first decision unit coupled to said delay extracting unit for making said determination of suitability, said first decision unit selecting in response to said frequency-domain delay-less modal scattering parameter curves a predefined primary one of said curve approximation options for modeling.

22. The system as recited in claim 21, wherein said simulation modeling unit when configured for said primary curve approximation option executes:

a vector fitting unit generating a partial fraction representation of each said frequency-domain delay-less modal scattering parameter curve, the partial fraction representation being defined by a set of real and complex poles and residues;

a state-space model unit coupled to said vector fitting unit, state-space model unit transforming said partial fraction representations of said frequency-domain delay-less modal scattering parameter curves to time-domain, thereby generating a time-domain state space model of the transmission line;

a passivity enforcement unit coupled to said state-space model unit, said passivity enforcement unit assessing and preserving the passivity of said time-domain state space model of the transmission line;

a delay insertion unit coupled to said passivity enforcement unit, said delay insertion unit inserting said propagation delay effect of the transmission line into said time-domain state space model to generate corresponding time-domain state space model formulations; and, a stamp unit coupled to said delay insertion unit, said stamp unit generating and applying a Modified Nodal Analysis (MNA) stamp based on said time-domain state space model formulations.

23. A system for adaptive modeling and simulation of a transmission line, comprising:

a processor system including a simulation unit supporting a plurality of simulation paths, said simulation unit selecting one of said curve simulation paths in response to a corresponding determination of suitability based upon predetermined criteria to generate a macromodel of the transmission line, said predetermined criteria including frequency-domain modal scattering parameters obtained for the transmission line according to frequency-dependent data characterizing the transmission line, wherein:

said simulation unit actuating a primary one of said simulation paths upon a positive determination of suitability, said simulation unit alternatively actuating a secondary one of said simulation paths upon a negative determination of suitability;

said simulation unit includes a transient simulator generating for the actuated one of said simulation paths time-domain transient simulation results for the transmission line based on a set of time-domain state space model formulations; and said simulation unit evaluates a stability of said transient simulation results and upon indication of instability selectively actuates an alternative one of said simulation paths for generating a replacement set of time-domain state space model formulations to re-execute said transient simulation thereon.

24. The system as recited in claim 23, wherein said simulation unit includes:

a scattering parameters formulation unit formulating said frequency-domain modal scattering parameters of the transmission line based on said frequency-dependent data characterizing the transmission line;

a propagation delay extracting unit coupled to said scattering parameters formulation unit and generating frequency-domain delay-less modal scattering parameter curves of the transmission line;

a plurality of approximation units, including a vector fitting based unit and a convolution based unit;

a decision unit coupled to said delay extracting unit to analyze said frequency-domain delay-less modal scattering parameter curves of the transmission line and select one of said approximation units, said simulation unit selectively actuating one of said vector fitting and convolution based units in response to said determination of suitability, the selectively actuated one of said approximation units executing upon said frequency-domain delay-less modal scattering parameter curves to generate partial fraction representations of said frequency-domain delay-less modal scattering parameter curves;

a state space formulation unit operably coupled to said selectively actuated one of said approximation units to transform said partial fraction representations from frequency-domain to time-domain, thereby generating an assessment unit for passivity assessment of a time-domain state space model of the transmission line; and, a delay insertion unit inserting said propagation delay into said time-domain state space model to generate corresponding time-domain state space model formulations.

25. A computer program product for adaptively modeling and simulating high speed response of a transmission line, the computer program product comprising a non-transitory computer usable medium having a computer readable program code embodied therein, the computer readable program code comprising program instructions for:

establishing a plurality of curve approximation options for modeling the transmission line;

actuating a simulation unit implemented in a processing system to selectively execute one of said curve approximation options in response to a corresponding determination of suitability based upon predetermined criteria to generate a macromodel of the transmission line, wherein:

said predetermined criteria include frequency-domain modal scattering parameters obtained for the transmission line according to frequency-dependent data characterizing the transmission line; and, a primary one of said curve approximation options is executed upon a positive determination of suitability, and a secondary one of said curve approximation options is alternatively executed upon a negative determination of suitability; and, executing transient simulation upon said macromodel of the transmission line.

26. The computer program product recited in claim 25, wherein said determination of suitability includes:

initially defining a set of said frequency-domain modal scattering parameters for the transmission line based on said frequency-dependent data characterizing the transmission line;

extracting from said frequency-domain modal scattering parameters a propagation delay effect of the transmission line, thereby generating delay-less modal scattering parameter curves for the transmission line; and, establishing said positive determination of suitability in response to said frequency-domain delay-less modal scattering parameter curves and selecting a predefined primary one of said curve approximation options for modeling.

27. The computer program product recited in claim 26, wherein said primary curve approximation option includes:

generating a partial fraction representation of each said frequency-domain delay-less modal scattering parameter curve, the partial fraction representation being defined by a set of real and complex poles and residues;

transforming said partial fraction representations of said frequency-domain delay-less modal scattering parameter curves to time-domain, thereby generating a time-domain state space model of the transmission line;

assessing and preserving the passivity of said time-domain state space model of the transmission line;

inserting said propagation delay effect of the transmission line into said time-domain state space model to generate corresponding time-domain state space model formulations; and, generating and applying a Modified Nodal Analysis (MNA) stamp based on said time-domain state space model formulations.

28. The computer program product recited in claim 27, wherein said primary curve approximation executes a vector fitting approximation to generate said partial fraction representation of each said frequency-domain delay-less modal scattering parameter curve, said curve approximation options further including a convolution based method.

29. The computer program product recited in claim 26, wherein said determination of suitability includes comparative analysis based on a count of maximum and minimum points within a portion of said frequency-domain delay-less modal scattering parameter curves, said primary curve approximation being selectively executed upon said count being less than a predetermined maximum count value.

30. The computer program product recited in claim 29, wherein said primary curve approximation executes a vector fitting approximation to generate said partial fraction representation of each said frequency-domain delay-less modal scattering parameter curve; and, a number of starting poles for said vector fitting approximation is established in proportional relation to said count of maximum and minimum points of said frequency-domain delay-less modal scattering parameter curves; and, wherein said simulation unit is actuated to execute a convergence loop including:

checking for convergence of said partial fraction representations resulting from said vector fitting approximation; and, upon failure of said convergence check adjusting said number of said starting poles and repeating said vector fitting approximation based thereon.

31. The computer program product recited in claim 25, wherein said program instructions of the computer readable program code further comprise:

analyzing an output of said transient simulation for stability of transient simulation results; and, upon indication of unstable results from said analysis, alternatively executing another of said curve approximation options and repeating transient simulation upon an alternate macromodel of the transmission line obtained thereby.

* * * * *